(12) United States Patent
Umezawa

(10) Patent No.: US 10,643,723 B2
(45) Date of Patent: May 5, 2020

(54) SEMICONDUCTOR MEMORY DEVICE

(71) Applicant: TOSHIBA MEMORY CORPORATION, Minato-ku (JP)

(72) Inventor: Yusuke Umezawa, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/275,707

(22) Filed: Feb. 14, 2019

(65) Prior Publication Data
US 2020/0090771 A1 Mar. 19, 2020

(30) Foreign Application Priority Data
Sep. 13, 2018 (JP) .................. 2018-171315

(51) Int. Cl.
*G11C 7/00* (2006.01)
*G11C 16/34* (2006.01)
*G11C 16/10* (2006.01)
G11C 16/04 (2006.01)
G11C 11/56 (2006.01)
H01L 27/1157 (2017.01)
H01L 27/11519 (2017.01)
H01L 27/11565 (2017.01)
H01L 27/11524 (2017.01)

(52) U.S. Cl.
CPC .......... *G11C 16/3459* (2013.01); *G11C 16/10* (2013.01); *G11C 11/5628* (2013.01); *G11C 11/5671* (2013.01); *G11C 16/0483* (2013.01); *H01L 27/1157* (2013.01); *H01L 27/11519* (2013.01); *H01L 27/11524* (2013.01); *H01L 27/11565* (2013.01)

(58) Field of Classification Search
CPC ....... G11C 7/1078; G11C 7/22; G11C 7/1072; G11C 7/1006; G11C 7/1096
USPC .......................... 365/189.14, 189.16, 185.22
See application file for complete search history.

(56) References Cited

U.S. PATENT DOCUMENTS

| | | | |
|---|---|---|---|
| 8,699,271 B2 | 4/2014 | Maejima | |
| 9,269,445 B1 | 2/2016 | Abe et al. | |
| 9,653,168 B2 | 5/2017 | Kim | |
| 9,922,705 B1* | 3/2018 | Diep | G11C 11/5628 |
| 9,984,754 B2 | 5/2018 | Sakamoto et al. | |
| 2013/0279257 A1* | 10/2013 | Costa | G11C 5/02 365/185.17 |

FOREIGN PATENT DOCUMENTS

| | | |
|---|---|---|
| JP | 2013-58275 | 3/2013 |
| JP | 2016-62624 | 4/2016 |

* cited by examiner

*Primary Examiner* — Son T Dinh
(74) *Attorney, Agent, or Firm* — Oblon, McClelland, Maier & Neustadt, L.L.P.

(57) ABSTRACT

At a time of writing first data to a first memory cell, second data which is written later to an adjacent second memory cell is referred to, and when a value of the second data corresponds to a first threshold level, a verify voltage is set to a first verify voltage, and when the value of the second data corresponds to a second threshold level greater than the first threshold level, the verify voltage is set to a second verify voltage smaller than the first verify voltage.

20 Claims, 19 Drawing Sheets

| WRITE DATA | | VERIFY VOLTAGE |
|---|---|---|
| MC00 | MC01 | |
| Er | – | – |
| A | Er | Va1 |
|  | A,B,C | Va2 |
| B | Er | Vb1 |
|  | A,B,C | Vb2 |
| C | Er | Vc1 |
|  | A,B,C | Vc2 |

MC00: MEMORY CELL TO BE CURRENTLY WRITTEN

MC01: MEMORY CELL TO BE WRITTEN LATER

| WRITE DATA | | VERIFY VOLTAGE |
|---|---|---|
| MC00 | MC01 | |
| Er | – | – |
| A | Er | Va1 |
| | A | Va2 |
| | B | Va3 |
| | C | Va4 |
| B | Er | Vb1 |
| | A | Vb2 |
| | B | Vb3 |
| | C | Vb4 |
| C | Er | Vc1 |
| | A | Vc2 |
| | B | Vc3 |
| | C | Vc4 |

MC00: MEMORY CELL TO BE CURRENTLY WRITTEN

MC01: MEMORY CELL TO BE WRITTEN LATER

FIG. 17

| WRITE DATA | | BIT LINE BL VOLTAGE AT THE TIME OF FINAL WRITE |
|---|---|---|
| MC00 | MC01 | |
| Er | – | – |
| A | Er | Vss |
| | A,B,C | Vbb |
| B | Er | Vss |
| | A,B,C | Vbb |
| C | Er | Vss |
| | A,B,C | Vbb |

MC00: MEMORY CELL TO BE CURRENTLY WRITTEN

MC01: MEMORY CELL TO BE WRITTEN LATER

| WRITE DATA | | VERIFY VOLTAGE |
|---|---|---|
| MC00 | MC01(Lower) | |
| Er | – | – |
| A | 1 | Va2 |
| | 0 | Va1 |
| B | 1 | Vb2 |
| | 0 | Vb1 |
| C | 1 | Vc2 |
| | 0 | Vc1 |
| D | 1 | Vd2 |
| | 0 | Vd1 |
| E | 1 | Ve2 |
| | 0 | Ve1 |
| F | 1 | Vf2 |
| | 0 | Vf1 |
| G | 1 | Vg2 |
| | 0 | Vg1 |

MC00: MEMORY CELL TO BE CURRENTLY WRITTEN

MC01: MEMORY CELL TO BE WRITTEN LATER

FIG. 25

| WORD LINE z | WLze 1st 1stage /Foggy | WLzo 1st 1stage /Foggy | WLze 2nd 1stage /Fine | WLzo 2nd 1stage /Fine |
|---|---|---|---|---|
| 0 | 1 | 2 | ④ | ⑥ |
| 1 | 3 | 5 | ⑧ | ⑩ |
| 2 | 7 | 9 | ⑫ | ⑭ |
| ⋮ | ⋮ | ⋮ | ⋮ | ⋮ |

FIG. 26

| WORD LINE z | WLze 1st 1stage /Foggy | WLzo 1st 1stage /Foggy | WLze 2nd 1stage /Fine | WLzo 2nd 1stage /Fine |
|---|---|---|---|---|
| 0 | 1 | 2 | ⑤ | ⑥ |
| 1 | 3 | 4 | ⑨ | ⑩ |
| 2 | 7 | 8 | ⑬ | ⑭ |
| ⋮ | ⋮ | ⋮ | ⋮ | ⋮ |

SEMICONDUCTOR MEMORY DEVICE

CROSS-REFERENCE TO RELATED APPLICATIONS

This application is based upon and claims the benefit of Japanese Patent Application No. 2018-171315, filed on Sep. 13, 2018, the entire contents of which are incorporated herein by reference.

BACKGROUND

Field

Embodiments of the present invention relate to a semiconductor memory device.

Description of the Related Art

A semiconductor memory device including a substrate, and a memory cell array including a plurality of memory cells arrayed in a first direction intersecting the surface of the substrate and a second direction intersecting the first direction, for example, is known as a semiconductor memory device that stores a large volume of data.

BRIEF DESCRIPTION OF THE DRAWINGS

FIG. 17 is a diagram showing a relationship between write data and a bit line voltage at the time of final data writing of the semiconductor memory device.

FIG. 25 is a diagram showing the writing order of a semiconductor memory device according to an eighth embodiment.

FIG. 26 is a diagram showing the writing order of a semiconductor memory device according to a ninth embodiment.

DETAILED DESCRIPTION

Figure 1:
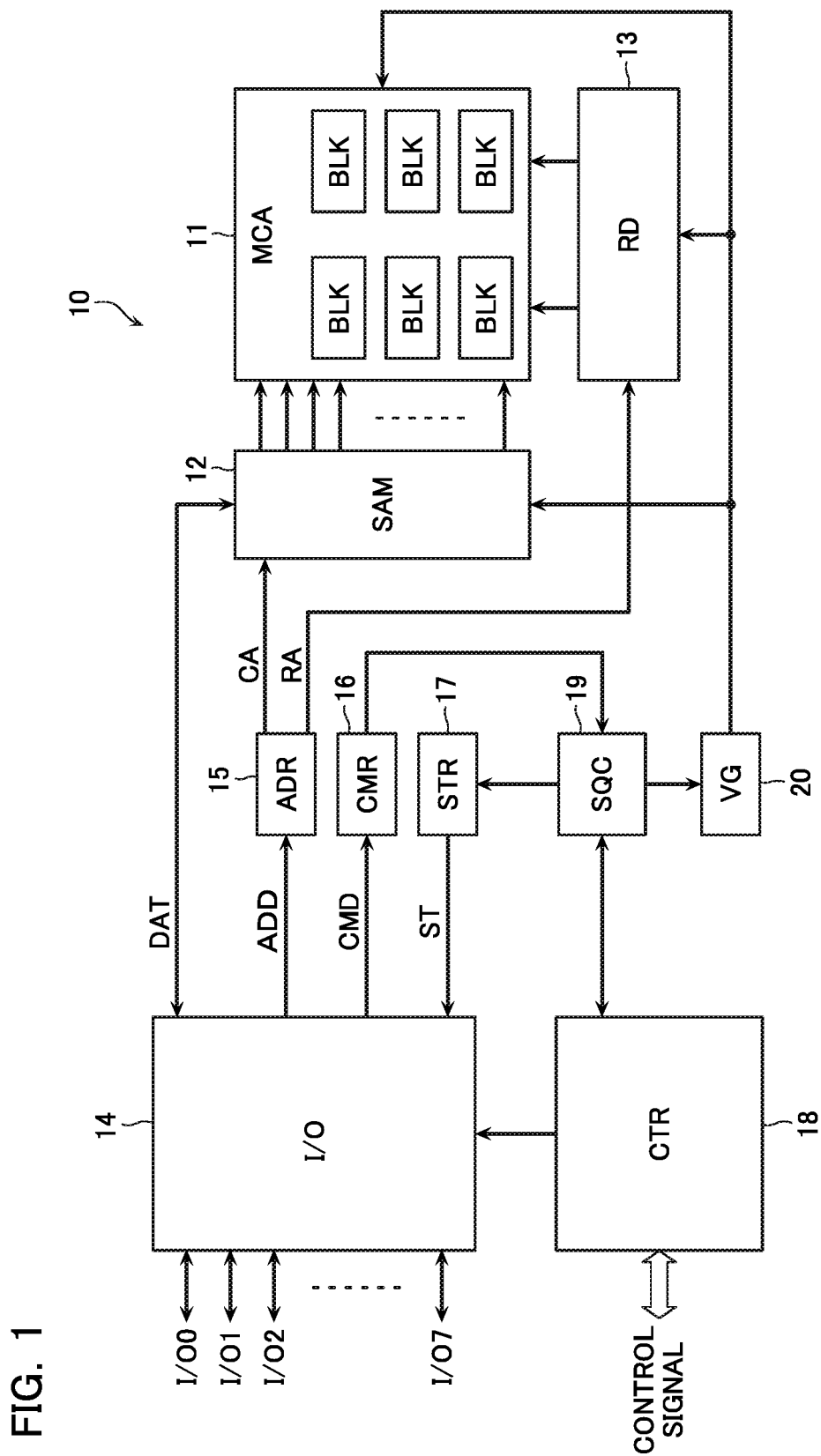
FIG. 1 is a block diagram of a semiconductor memory device according to a first embodiment.

A semiconductor memory device according to an embodiment includes: a substrate; a memory cell array including a plurality of memory cells arrayed in a first direction crossing the substrate and a second direction crossing the first direction, wherein the memory cells can store data indicating a plurality of values corresponding to a plurality of threshold levels; and a control circuit that applies a predetermined voltage to the memory cells to change threshold voltages of the memory cells to a threshold level corresponding to a value of data to be stored respectively, and terminates writing of the data when the threshold level of the memory cells exceeds a predetermined verify voltage. The memory cell array includes a first memory cell in which first data is stored and a second memory cell adjacent to the first memory cell and in which second data is written after the writing to the first memory cell. The control circuit refers to the second data at a time of writing the first data to the first memory cell, and when a value of the second data corresponds to a first threshold level, sets the verify voltage to a first verify voltage, and when the value of the second data corresponds to a second threshold level greater than the first threshold level, sets the verify voltage to a second verify voltage smaller than the first verify voltage.

Another semiconductor memory device according to an embodiment includes a substrate, a memory cell array, and a control circuit. The memory cell array includes a first memory string, a second memory string, and first to third conductive layers. The first memory string includes a plurality of memory cells connected in series in a first direction crossing the substrate. The second memory string includes a plurality of memory cells connected in series in the first direction, and is adjacent to the first memory string in a second direction crossing the first direction. The plurality of first conductive layers are respectively connected to the memory cells of the first memory string and are arranged in the first direction. The plurality of second conductive layers are respectively connected to the memory cells of the second memory string and are arranged in the first direction. The third conductive layer is connected to one end of the first memory string. The memory cells can store data indicating a plurality of values corresponding to a plurality of threshold levels. The control circuit applies a predetermined voltage to the first to third conductive layers according to a plurality of writing steps, to change threshold voltages of the memory cells to a threshold level corresponding to a value of data to be stored respectively, and performs a final writing step to terminate writing of the data to a certain memory cell when the threshold level of the certain memory cell exceeds a predetermined verify voltage. The memory cell array includes a first memory cell in which first data is stored and a second memory cell adjacent to the first memory cell and in which second data is written after the writing to the first memory cell. The first memory cell is included in the first memory string. The control circuit refers to the second data at a time of writing the first data to the first memory cell, and when a value of the second data corresponds to a first threshold level, sets a voltage to be applied to the third conductive layer in the final writing step to a first voltage, and when the value of the second data corresponds to a second threshold level greater than the first threshold level, sets the voltage to be applied to the third conductive layer in the final writing step to a second voltage greater than the first voltage.

The following describes semiconductor memory devices according to embodiments in detail with reference to the accompanying drawings. Note that the embodiments below are merely examples, and are not shown with the intention of limiting the present invention.

First Embodiment

[Configuration]

FIG. 1 is a block diagram of a semiconductor memory device according to a first embodiment.

The semiconductor memory device 10 according to the present embodiment includes a memory cell array 11, and a control circuit for controlling erasure, writing and reading of data on the memory cell array 11. The control circuit in this embodiment includes a sense amplifier module 12, a row decoder 13, an input/output circuit 14, registers 15 to 17, a controller 18, a sequencer 19 and a voltage generating circuit 20. However, the configuration of the control circuit shown here is merely an example, and other configurations having at least a function of writing data can also be adopted.

The memory cell array 11 includes a plurality of memory blocks BLK. The memory block BLK is a set of a plurality of non-volatile memory cells connected to bit lines and word lines, and is, for example, a unit for data erasure. The memory cell array 11 stores 1-bit data or multi-value data of two or more bits in each memory cell.

The sense amplifier module 12 includes a plurality of data latches that exchange data DAT with an external controller (not shown) via the input/output circuit 14 to temporarily store the data DAT, a sense amplifier that writes data to the memory cell array 11 and reads data from the memory cell array 11, and a column address decoder that selects the bit lines of the memory blocks BLK to be accessed.

The row decoder 13 selects a word line corresponding to memory cells to be subjected to a reading operation and a writing operation. Then, the row decoder 13 applies predetermined voltages to the selected word line and non-selected word lines, respectively.

The input/output circuit 14 transmits and receives input/output signals I/O (I/O1 to I/O8) having a predetermined bit width, an 8-bit width in this example, to and from the external controller. For example, the input/output circuit 14 receives data DAT, address information ADD and various commands CMD included in the input/output signal I/O from the external controller. Further, the input/output circuit 14 transmits read data DAT transferred from the sense amplifier module 12 and status information ST output from the sequencer 19 to the external controller as the input/output signal I/O.

Further, the semiconductor memory device 10 includes, as the registers 15 to 17, an address register 15, a command register 16 and a status register 17. The address register 15 receives address information ADD from the input/output circuit 14, and holds this address information ADD. The address register 15 transfers a column address CA and a row address RA included in the address information ADD to the sense amplifier module 12 and the row decoder 13, respectively. The command register 16 receives the command CMD from the input/output circuit 14, and holds the command CMD. The command CMD held in the command register 16 is supplied to the sequencer 19. The status register 17 holds the status information ST supplied from the sequencer 19. The status information ST includes, for example, information indicating the operational status of the sequencer 19.

The controller 18 receives various control signals from the external controller, and controls the input/output circuit 14 and the sequencer 19. The control signals include, for example, a chip enable signal CE, a command latch enable signal CLE, an address latch enable signal ALE, a write enable signal WE, a read enable signal RE, and a write protect signal WP.

The sequencer 19 controls the general operation of the semiconductor memory device 10. Specifically, based on commands CMD transferred from the command register 16, the sequencer 19 controls the sense amplifier module 12, the row decoder 13, the voltage generating circuit 20, etc. to perform a data erasing operation, a data writing operation, a data reading operation, etc.

The voltage generating circuit 20 generates predetermined voltages used for the data erasing operation, the data writing operation, and the data reading operation based on instructions from the sequencer 19. The voltage generating circuit 20 supplies the generated voltage to the memory cell array 11, the sense amplifier module 12, and the row decoder 13. A write voltage and a write inhibit voltage which are supplied to the bit lines, and a write voltage, a verify voltage, and the like which are supplied to the word lines are also generated by the voltage generating circuit 20.

Figure 2:
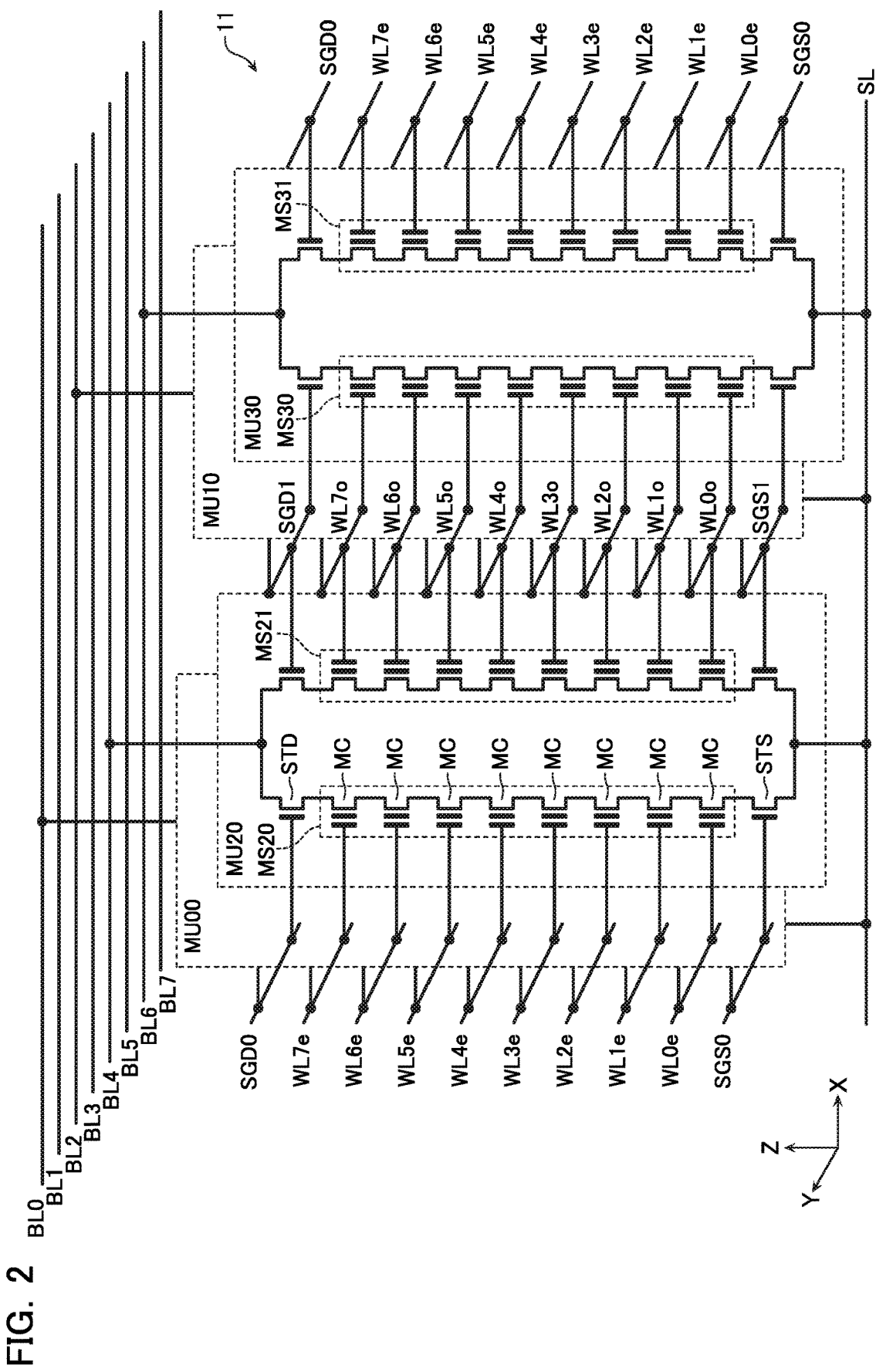
FIG. 2 is an equivalent circuit diagram of a part of a memory cell array of the semiconductor memory device.

FIG. 2 is a schematic equivalent circuit diagram showing a part of the memory cell array 11.

In the following description, the direction in which memory cells MC connected in series in the memory string MS are arranged (the direction crossing the surface of the substrate) may be referred to as a Z direction, the direction which crosses the Z direction and in which bit lines BL extend may be referred to as an X direction, and the direction which crosses the X direction and Z direction and in which word lines WL extend may be referred to as a Y direction. In addition, the notations such as "MUyx", "MSyx", "MCyxz" and the like indicate the y-th memory element in the Y direction, the x-th memory element in the X direction, and the z-th memory element in the Z direction where x, y, z=0, 1, 2, and so forth. Further, "WLze" indicates the z-th word line in the Z direction and an even-numbered word line in the X direction, and "WLzo" indicates the z-th word line in the Z direction and an odd-numbered word line in the X direction. Also, when these components are collectively referred to, x, y, z, e, and o may not be attached.

In FIG. 2, the memory cell array 11 includes a plurality of memory units MUyx (MU00, MU10, MU20, MU30, etc.). Each of those memory units MUyx includes two memory strings MSyx, MSyx$_{+1}$ (MS20, MS21, etc.). The two memory strings MSyx, MSyx$_{+1}$ are adjacent to each other in the X direction and are electrically independent from each other.

The memory strings MSyx, MSyx$_{+1}$ each include a plurality of memory cells MC connected in series in the Z direction. The memory cell MC is a field-effect transistor including a semiconductor film, a gate insulating film, and a gate electrode. The semiconductor film functions as a channel region. The gate insulating film has a memory part capable of storing data. This memory part is, for example, a charge accumulation film such as a silicon nitride film (SiN) or a floating gate. The threshold voltage of the memory cell MC varies according to the quantity of charges in the charge accumulation film. The gate electrode is connected to a word line WL.

The memory unit MUyx includes drain select transistors STD connected to one ends of the memory strings MSyx, MSyx$_{+1}$, and source select transistors STS connected to the other ends of the memory strings MSyx, MSyx$_{+1}$. One ends of the memory strings MSyx, MSyx$_{+1}$ are connected to a common bit line BL via the drain select transistors STD, respectively. The other ends of the memory strings MSyx, MSyx$_{+1}$ are connected to a common source line SL via the source select transistors STS, respectively.

The select transistor (STD, STS) is a field-effect transistor including a semiconductor film, a gate insulating film, and a gate electrode. The semiconductor film functions as a channel region. The gate electrode of the drain select transistor STD is connected to a drain select gate line SGD. The gate electrode of the source select transistor STS is connected to a source select gate line SGS.

The gate electrode of the memory cell MC connected in the memory string MSyx is connected to one of the word lines WLze and WLzo, and the gate electrode of the memory cell MC connected in the memory string MSyx$_{+1}$ is connected to the other one of the word lines WLze and WLzo. The gate electrode of the drain select transistor STD connected to one end of the memory string MSyx is connected to one of the drain select gate lines SGD0 and SGD1, and the gate electrode of the drain select transistor STD connected to one end of the memory string MSyx$_{+1}$ is connected to the other one of the drain select gate lines SGD0 and SGD1. The gate electrode of the source select transistor STS connected to the other end of the memory string MSyx is connected to one of the source select gate lines SGS0 and SGS1, and the gate electrode of the source select transistor STS connected to the other end of the memory string MSyx$_{+1}$ is connected to the other one of the source select gate lines SGS0 and SGS1.

Adjacent memory strings MSyx, MSy$_{+2}$x in the memory units MUyx, MUy$_{+2}$x adjacent to each other in the Y direction are connected to a common word line WLze (or WLzo), the drain select gate line SGD0 (or SGD1) and the source select gate line SGS0 (or SGS1). In the same memory block BLK, even-numbered word lines WLze in the X direction are commonly connected, and odd-numbered word lines WLzo in the X direction are also commonly connected. In addition, in a range smaller than the memory block BLK, in a sub block in which the bit line BL is connected to the sole memory unit MU, the even-numbered drain select gate line SGD0 and source select gate line SGS0 in the X direction are commonly connected, and the odd-numbered drain select gate line SGD1 and source select gate line SGS1 in the X direction are also commonly connected.

Figure 3:
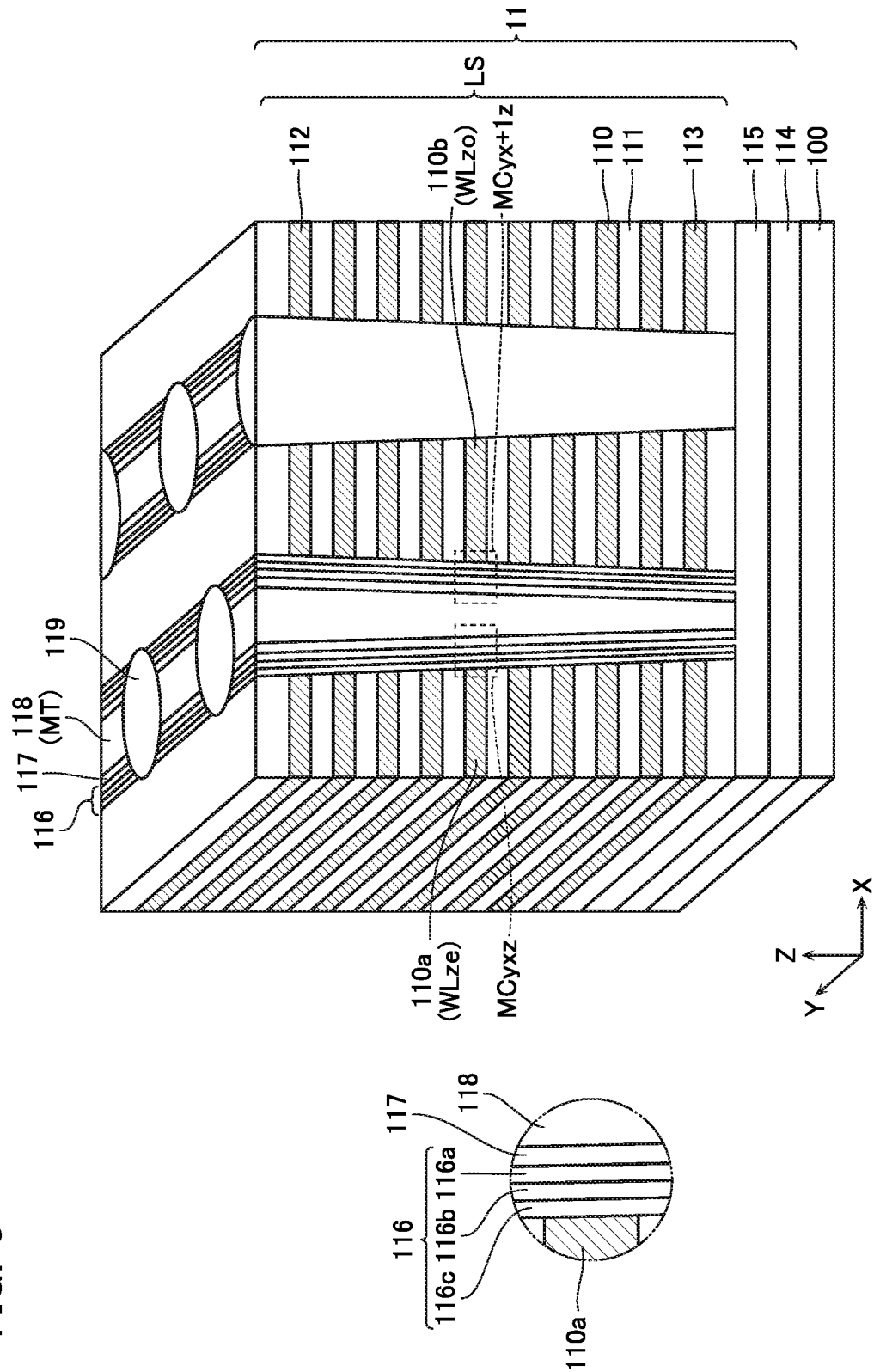
FIG. 3 is a schematic perspective view showing the configuration of the memory cell array.
Figure 4:
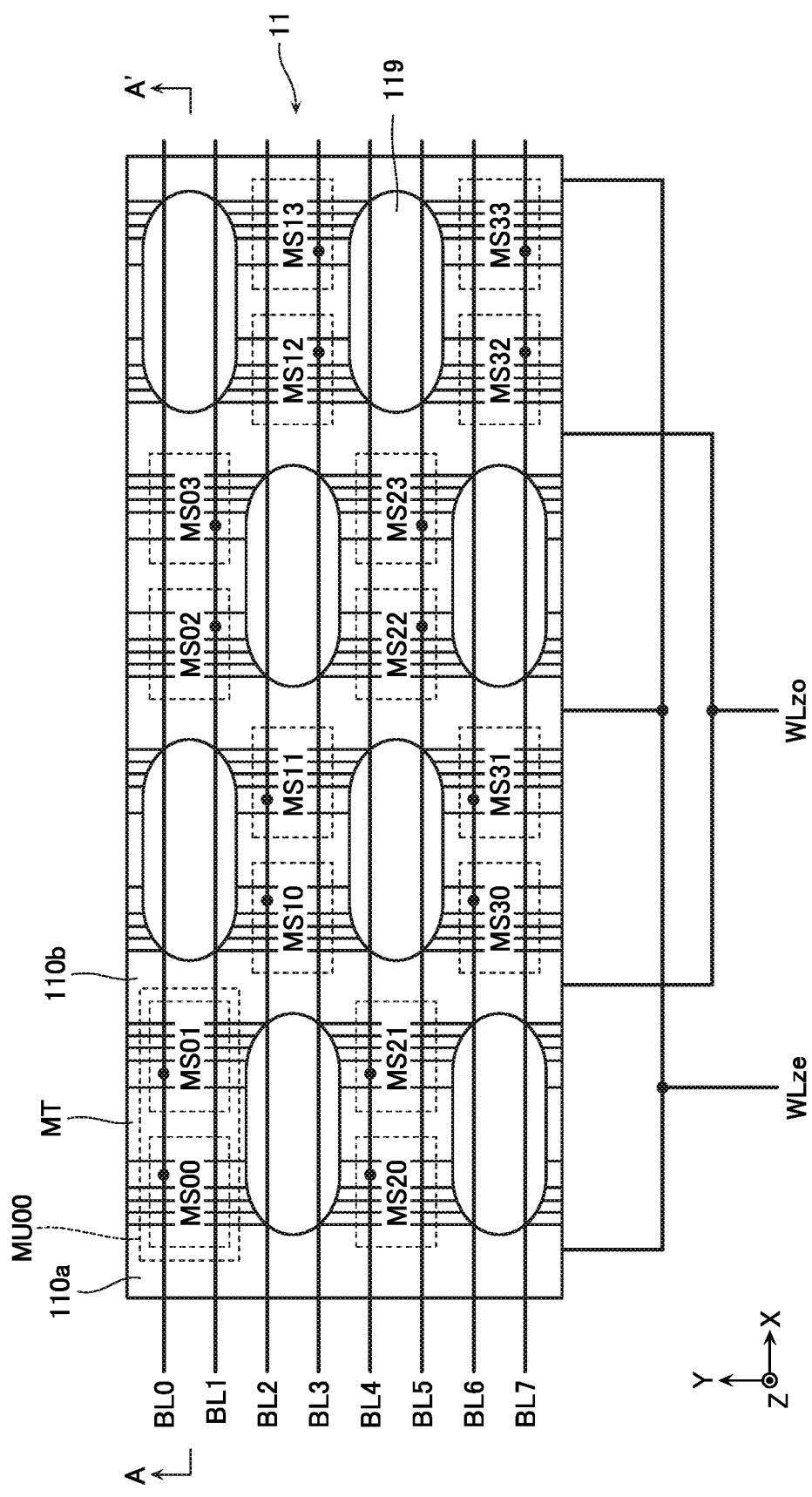
FIG. 4 is a schematic plan view showing the configuration of the memory cell array.
Figure 5:
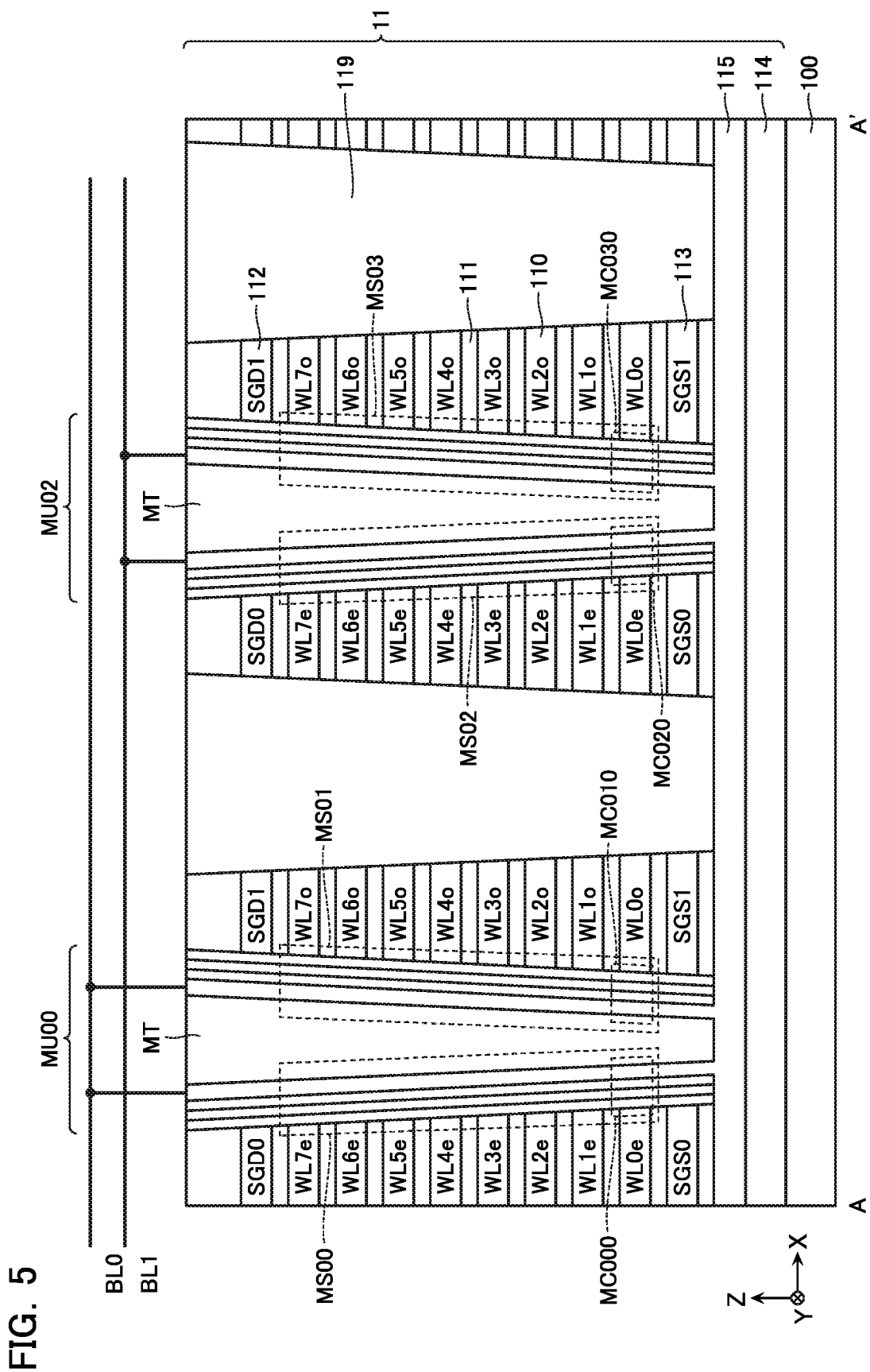
FIG. 5 is a schematic cross-sectional view along A-A' in FIG. 4.

FIG. 3 is a schematic perspective view showing the configuration of a part of the memory cell array 11, FIG. 4 is also a schematic plan view, and FIG. 5 is a schematic cross-sectional view in the arrowed direction along line A-A' in FIG. 4. Here, the cross section of the memory cell array 11 shown in FIG. 5 which is parallel to the XZ plane corresponds to the foregoing sub block portion, which is a range in which each bit line BL is connected to the sole memory unit MU. It should be noted that in the following description, the direction away from the substrate in the Z direction may be referred to as "above" or "upper", while the direction approaching the substrate in the Z direction may be referred to as "below" or "lower". Further, the Z direction may be associated with the first direction, and the X direction may be associated with the second direction.

The semiconductor memory device 10 according to the present embodiment includes a substrate 100, a memory cell array 11 disposed above the substrate 100. The memory cell array 11 includes a laminate structure LS including a plurality of conductive layers 110 and insulating layers 111 disposed alternately in the Z-direction, and conductive layers 112 and 113 respectively disposed above and below the laminate of these conductive layers 110 and insulating layers 111. An insulating layer 114 and a wiring layer 115 are provided between the substrate 100 and the laminate structure LS in order from the substrate 100 side. Memory trenches MT are provided in the laminate structure LS at predetermined intervals in the X direction. The memory trenches MT extend in the Y and Z directions, dividing the laminate structure LS in the X direction.

The substrate 100 is, for example, a semiconductor substrate of single crystal silicon (Si) or the like. Transistors and wirings, for example, which constitute the above-described control circuit, may be provided on the surface of the substrate 100. The conductive layers 110, 112, and 113 are formed of, for example, a laminate film of titanium nitride (TiN) and tungsten (W), polycrystalline silicon (p-Si) implanted with an impurity, or the like.

The conductive layers 110, 112, and 113 are divided into the X direction by the memory trenches MT, so that the conductive layers 110, 112, and 113 function as plate-like electrode extending in the Y direction and independent of one another in the X direction.

As shown in FIG. 5, a plurality of conductive layers 110, respectively function as the word lines WL and gate electrodes of the memory cells MC (FIG. 2). The conductive layer 112 functions as the drain select gate line SGD and a gate electrode of the drain select transistor STD (FIG. 2). The conductive layer 113 functions as the source select gate line SGS and a gate electrode of the source select transistor STS (FIG. 2). The insulating layer 111 formed between the plurality of conductive layers 110, 112, 113 and on an upper layer of the conductive layer 112 and a lower layer of the conductive layer 113 are formed of, for example, silicon oxide (SiO$_2$) or the like. Note that a dummy word line may be disposed between the conductive layers 110 and the conductive layers 112, 113.

Hereinafter, when paying attention to two laminate structures LS adjacent to each other in the X direction, the plurality of conductive layers 110 included in one laminate structure LS may be referred to as first conductive layers 110a and the plurality of conductive layers 110 included in the other laminate structure LS may be referred to as second conductive layers 110b. The first conductive layers 110a correspond to the even-numbered word lines WLze, and the second conductive layers 110b correspond to the odd-numbered word lines WLzo.

An insulating layer 118 of silicon oxide ($SiO_2$) or the like is buried in the memory trench MT. A gate insulating film 116 and a semiconductor film 117 extending in the Z direction and the Y direction are provided between the laminate structure LS and the insulating layer 118. The semiconductor film 117 is formed of, for example, non-doped polycrystalline silicon (p-Si) or the like and functions as a channel region of the memory cell MC, the drain select transistor STD and the source select transistor STS.

The gate insulating film 116 disposed between the semiconductor film 117 and the conductive layer 110, as shown in an enlarged view of FIG. 3, for example, includes a tunnel insulating film 116a, a charge accumulation film 116b and a block insulating film 116c. The tunnel insulating film 116a and the block insulating film 116c are insulating films of, for example, silicon oxide ($SiO_2$) or the like. The charge accumulation film 116b is an insulating film of, for example, silicon nitride (SiN) or the like. A part or the whole of a film included in the gate insulating film 116 may be separated for each memory cell MC. The block insulating film 116c may include a laminate of an insulating film of silicon oxide ($SiO_2$) and an insulating film of alumina ($Al_2O_3$).

The first conductive layer 110a, the gate insulating film 116 and the semiconductor film 117 on the first conductive layer 110a side constitute a first memory cell MCyxz. Further, the second conductive layer 110b, the gate insulating film 116 and the semiconductor film 117 on the second conductive layer 110b side constitute a second memory cell $MCyx_{+1}z$. The memory cells MCyxz, $MCyx_{+1}z$ exchange electrons between the semiconductor film 117 and the charge accumulation film 116b via the tunnel insulating film 116a, based on voltages respectively applied to the conductive layers 110a, 110b, to change ON/OFF threshold voltages according to the quantity of the accumulated electrons in the charge accumulation film 116b.

Columnar insulating parts 119 extending in the Z direction are provided at predetermined intervals in the Y direction along the memory trench MT. The insulating part 119 is formed of, for example, silicon oxide ($SiO_2$) or the like. The insulating part 119 has an X-directional width set to a width that can separate the semiconductor film 117 and the gate insulating film 116 on both sides of the memory trench MT, and has a Z-directional length substantially equal to the Z-directional length of the memory trench MT. Thus, a pair of memory strings MS independent in the X direction and the Y direction are formed between the insulating parts 119 adjacent in the Y direction.

The wiring layer 115 is a plate-like conductive layer extending in the X and Y directions. The wiring layer 115 is a conductive layer of, for example, polycrystalline silicon (p-Si) implanted with an impurity or the like, and is connected to the lower end of the semiconductor film 117 to function as a source line SL (FIG. 2). Note that the structure of the source line SL can be appropriately modified. For example, the source line SL may be a part of the surface of the substrate 100. In addition, the source line SL may include metal layers of titanium nitride (TiN) and tungsten (W) or the like.

Though not shown, a plurality of third conductive layers extending in the X direction and disposed in the Y direction are provided over the laminate structure LS, and this third conductive layer constitutes a bit line BL connected to the upper end of the semiconductor film 117.

FIG. 4 shows a schematic cross-sectional view taken along an arbitrary conductive layer 110 of the memory cell array 11. The memory unit MUyx includes a pair of memory strings MSyx, $MSyx_{+1}$ (for example, MS00, MS01) adjacent in the X direction across the same memory trench MT. As shown in FIG. 4, in this embodiment, the Y-directional positions of the memory units MUyx are arranged to be shifted by half a pitch between the memory trenches MT adjacent in the X direction. Bit lines BL0 to BL7 extend in the X direction. The Y-directional pitch of the bit lines BL is set to, for example, ¼ of the pitch of the memory units MUyx arranged in the Y direction. Two bit lines BL are arranged above one memory unit MUyx. Two memory units MUyx, $MUyx_{+2}$ adjacent in the X direction are connected to different bit lines BL from each other. For example, memory strings MS00 and MS01 of a memory unit MU00 are connected to a bit line BL0, and memory strings MS02 and MS03 of a memory unit MU02 adjacent to the memory unit MU00 in the X direction are connected to a bit line BL1.

Figure 6A:
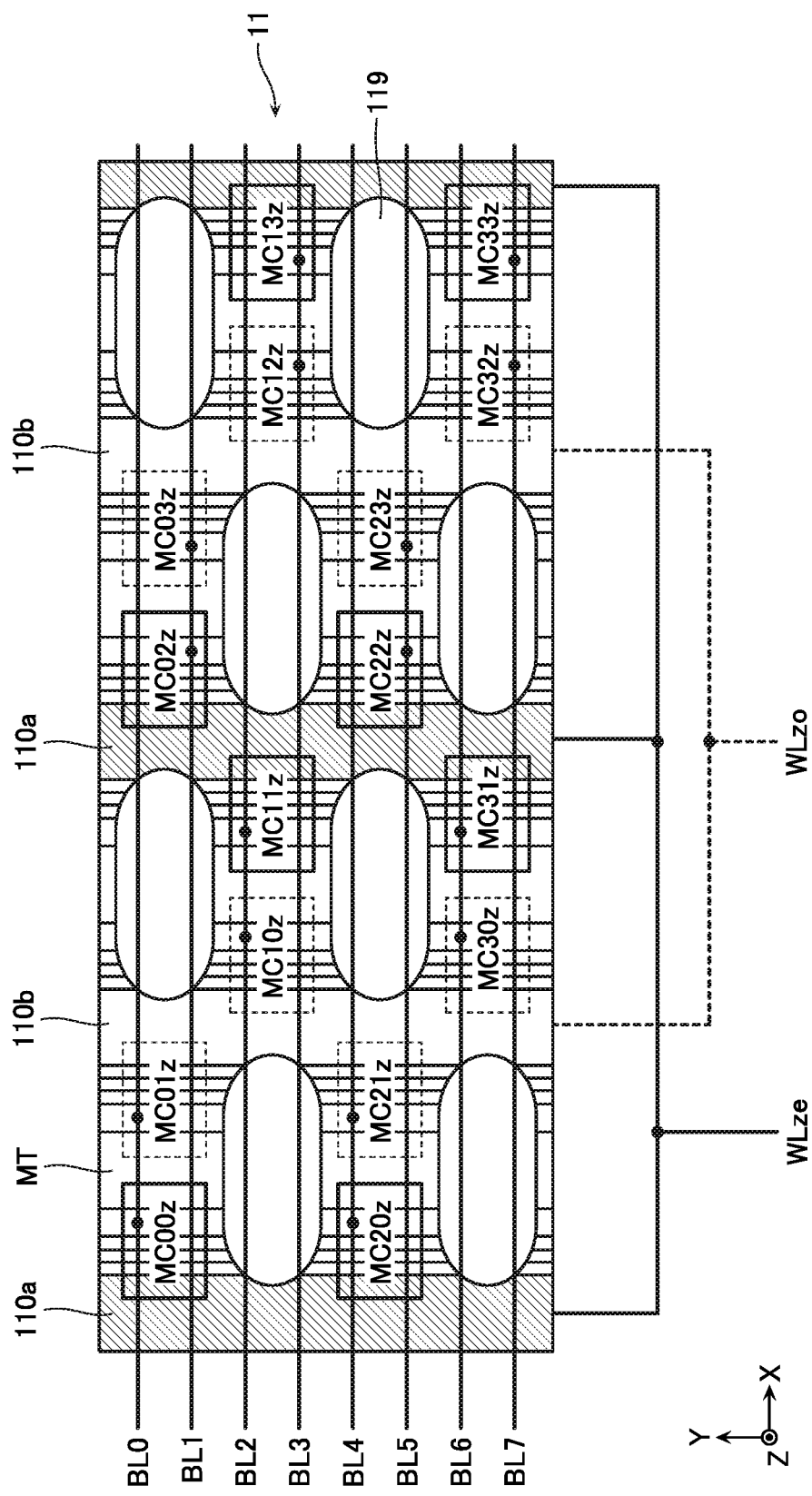
FIG. 6A is a cross-sectional view along an arbitrary word line in the memory cell array.
Figure 6B:
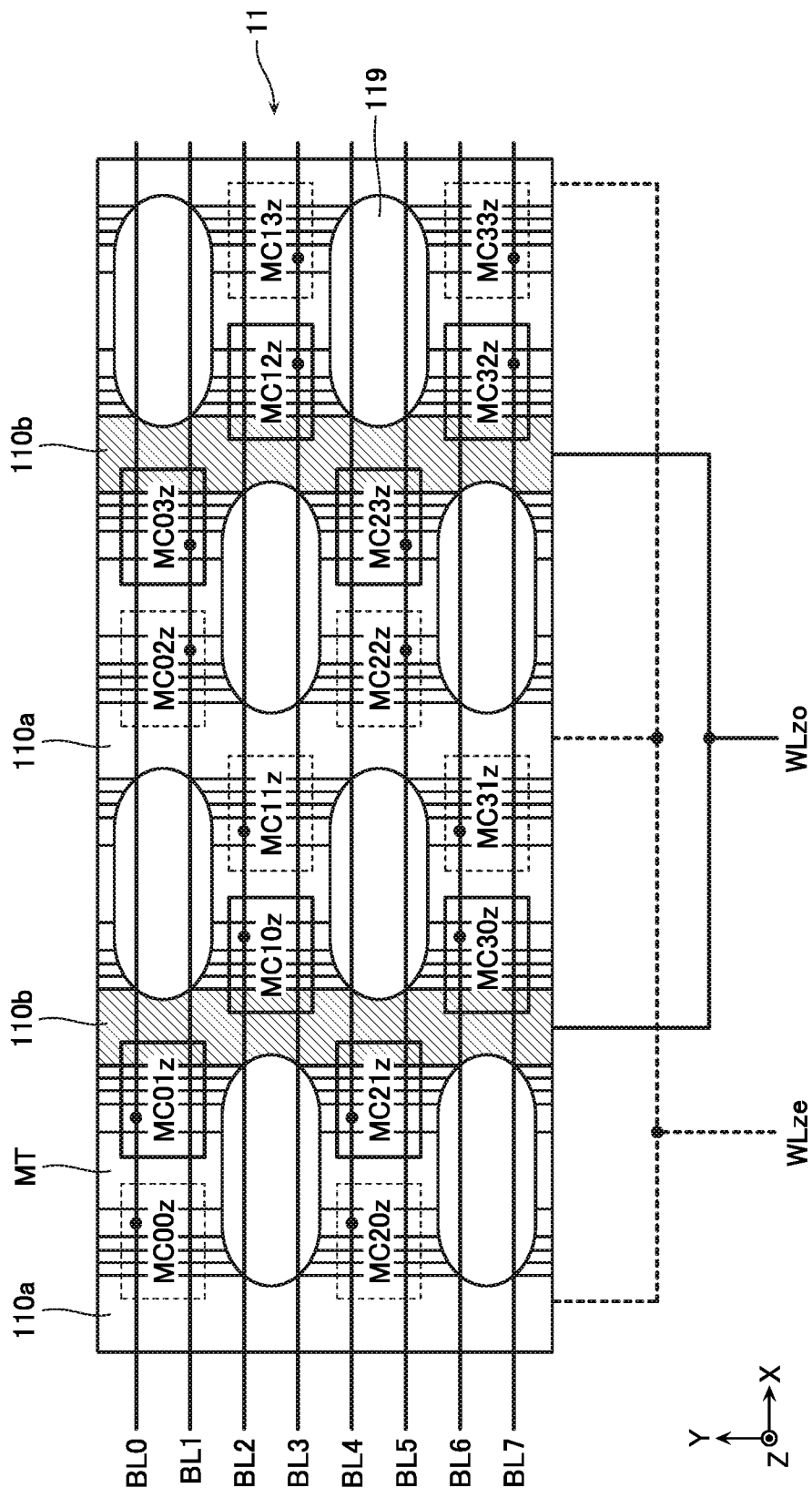
FIG. 6B is a cross-sectional view along an arbitrary word line in the memory cell array.

FIGS. 6A and 6B are cross-sectional views parallel to the XY plane along an arbitrary word line in FIG. 5.

As shown in FIG. 6A, when the word line WLze becomes active, memory cells MC00z, MC02z, MC11z, MC13z, MC20z, MC22z, MC31z and MC33z which are connected to the word line WLze are accessed. Each bit data to be written to the memory cells MC00z to MC33z, or read from the memory cells MC00z to MC33z constitutes one page which is a unit of data writing and data reading.

Further, as shown in FIG. 6B, when the word line WLzo becomes active, memory cells MC01z, MC03z, MC10z, MC12z, MC21z, MC23z, MC30z, and MC32z which are connected to the word line WLzo are accessed. Each bit data to be written to the memory cells MC01z to MC32z, or read from the memory cells MC01z to MC32z constitutes one page which is a unit of data writing and data reading.

In the following description, the memory cell MC00z connected to the word line WLze may be denoted as "MC00" as a first memory cell, and the memory cell MC01z connected to the word line WLzo may be denoted as "MC01" as a second memory cell. The memory cell MC00 in which first data D0 is written prior to the memory cell MC01 is adjacent to the memory cell MC01 in the X direction. Second data D1 is written to the memory cell MC01.

[Data Writing Operation]

Next, the data writing operation of the semiconductor memory device 10 configured as described above is described.

Figure 7:
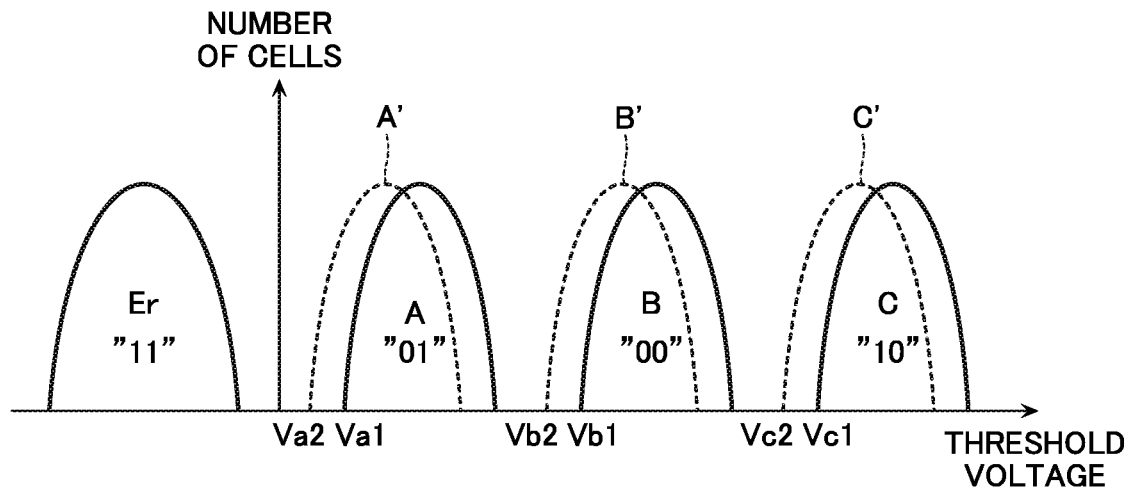
FIG. 7 is a diagram showing a relationship among a threshold voltage of memory cells in the memory cell array, the number of memory cells, and a verify voltage.

FIG. 7 shows a relationship among the threshold voltage of the memory cell MC, the number of memory cells, and the verify voltage. In the present embodiment, 2-bit (4-value) data is stored in each memory cell MC. In this case, two pages of data are written to each of the plurality of memory cells MC connected to the word lines WLze and WLzo common to the memory cells MC00 and MC01, respectively.

The values of 2-bit data to be written to the memory cell MC are four values of "11", "01", "00", and "10", the distributions of the corresponding threshold voltages being denoted by Er, A, B, and C, respectively. Hereafter, Er, A, B, and C may also be referred to as data values Er, A, B, and C. Er ("11") indicates the distribution of the threshold voltages of the memory cells MC in the erased state, which is a negative threshold voltage distribution. A ("01"), B ("00"), and C ("10") are the distributions of the threshold voltages in a case where a program voltage Vprg is applied to the memory cell MC in the erased state Er, and is increased by the writing operation. The levels of the threshold voltage distribution are Er. ABC. The verify voltages for determining the end of writing of the individual values A, B, and C are Va1, Vb1, and Vc1, respectively, whose levels are Va1<Vb1<Vc1.

As the distance between the memory cells becomes small as in the case of the memory cells MC00 and MC01 due to the miniaturization of the circuit, inter-cell interference due to a parasitic capacitance between the memory cells MC00 and MC01 may become a problem. For example, when, after writing the data to the memory cell MC00, data is written to the memory cell MC01 adjacent thereto, the threshold voltage of the memory cell MC00 may be increased due to the capacitive coupling with the memory cell MC01.

In this embodiment, therefore, at the time of writing data D0 to the memory cell MC00, write data D1 to the memory cell MC01 on which a writing operation is performed subsequently is referred to. If the value of the data D1 to be written to the memory cell MC01 is A, B or C, at the time of writing data to the memory cell MC00, the verify voltage is set to be slightly smaller than the normal voltage, and the threshold voltage lower than a target threshold voltage is written. This is shown dashed-lined distributions A', B', and C' in FIG. 7. In this case, the verify voltages at the time of writing data A, B, C are set to Va2, Vb2, Vc2 which are smaller than the verify voltages Va1, Vb1, Vc1, respectively. That is, Va2<Va1<Vb2<Vb1<Vc2<Vc1. Thus, after the subsequent writing in the memory cells MC01 is performed, the inter-cell interference increases the threshold voltage of the memory cell MC00, so that the threshold voltage can be set to the target threshold voltage.

Figure 8:
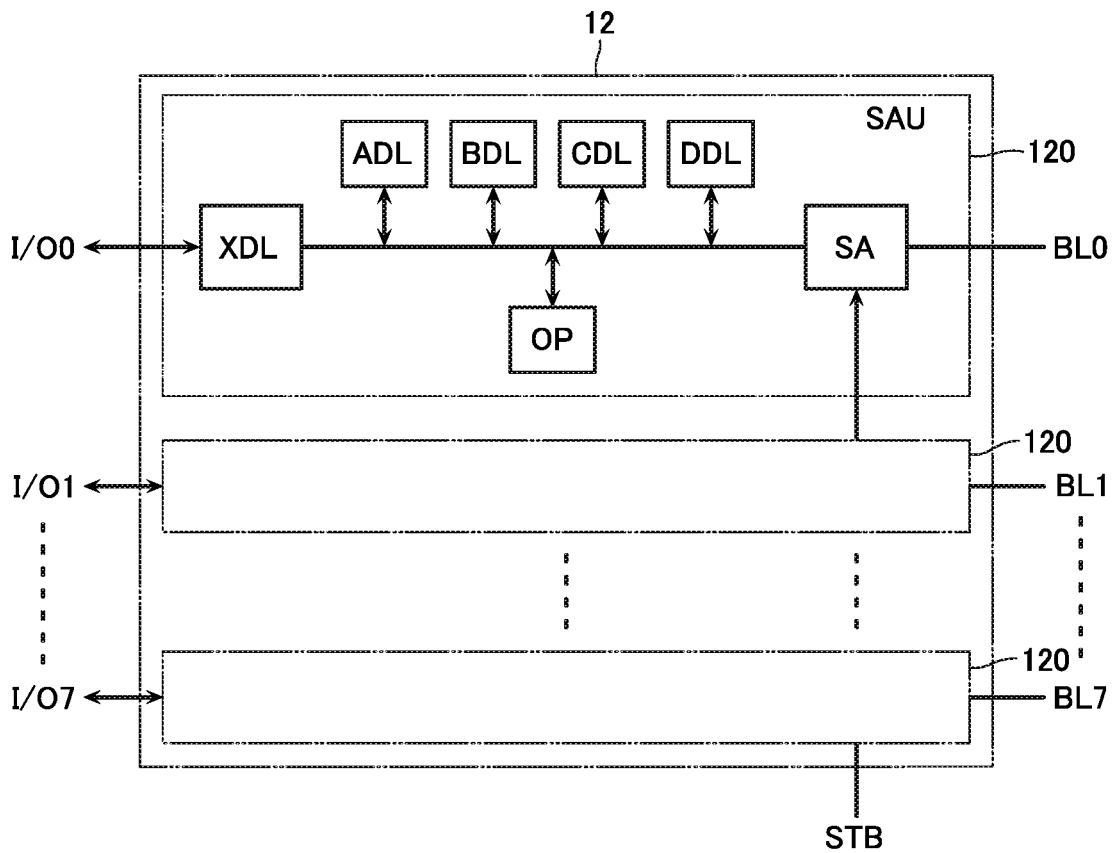
FIG. 8 is a block diagram of a sense amplifier module of the semiconductor memory device.

FIG. 8 is a block diagram showing a configurational example of the sense amplifier module 12 to implement such a writing method. The sense amplifier module 12 includes a plurality of sense amplifier units 120 respectively corresponding to the bit lines BL0 to BL7. Each sense amplifier unit 120 includes a sense amplifier SA, an operation unit OP, and five latch circuits ADL, BDL, CDL, DDL, and XDL.

The sense amplifier SA senses data read onto the corresponding bit line BL, and applies a voltage to the bit line BL according to the write data. At the time of data reading, the sense amplifier SA determines the read data by a strobe signal STB supplied from, for example, the sequencer 19. Then, the determined data is transferred to one of the latch circuits ADL, BDL, CDL, DDL, and XDL.

The latch circuits ADL, BDL, CDL and DDL temporarily hold read data and write data. In the present embodiment, at the time of data writing to the memory cell MC00, an L (Lower) page and a U (Upper) page of the write data D0 as well as an L page and a U page of data D1 to be written to the adjacent memory cell MC01, a total of four pages, and one bit for a flag FLG for terminating or inhibiting writing are held in the latch circuits ADL, BDL, CDL, DDL and XDL.

The operation unit OP performs various logical operations on the data held in the sense amplifier SA, the latch circuits ADL, BDL, CDL, DDL, and XDL. When the verify voltage is switched while distinguishing two states, Er and A, B and C, only one bit resulting from an AND operation of two bits of the L page and the U page may be held in the latch circuits as in the present embodiment. In this case, it is possible to reduce one latch circuit.

The sense amplifier SA, the latch circuits ADL, BDL, CDL, and DDL, and the operation unit OP are connected to one another by a bus so that data can be transmitted to and received from one another. This bus is further connected to the latch circuit XDL.

Data input/output in the sense amplifier module 12 is performed via the latch circuit XDL. The latch circuit XDL functions as a cache memory for the semiconductor memory device 10. Therefore, even if the latch circuits ADL, BDL, CDL, and DDL are in use, if the latch circuit XDL is not used, the semiconductor memory device 10 can be set in a ready state.

Figures 9, 10:
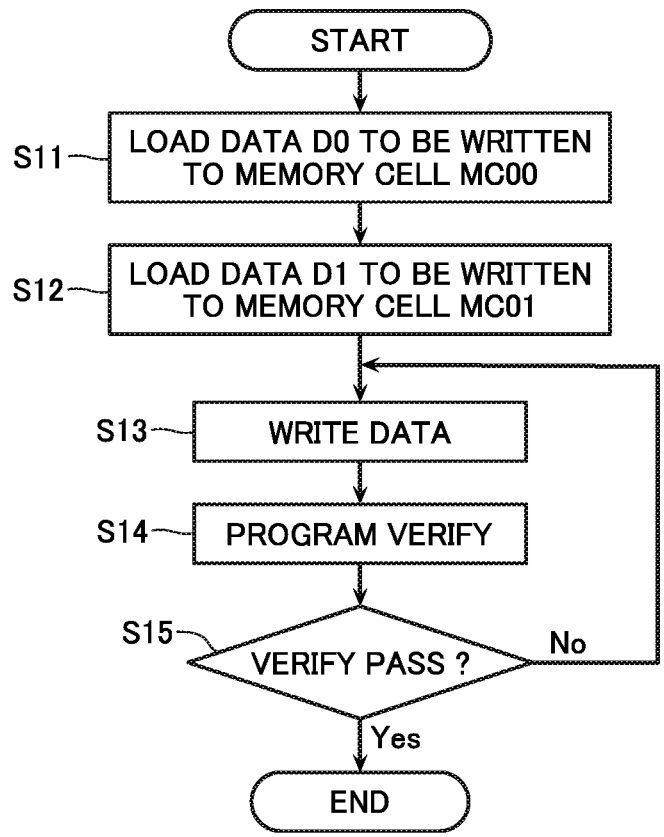
FIG. 9 is a flowchart of a sequencer illustrating a data writing process of the semiconductor memory device.
FIG. 10 is a diagram showing a relationship between write data and the verify voltage of the semiconductor memory device.

Next, a data writing process is described. FIG. 9 is a flowchart of the sequencer 19 illustrating the data writing process. In this embodiment, full-sequence data writing process in which data is written to the individual memory cells MC to the last in a single sequence is carried out.

First, data D0 to be written to the memory cell MC00 is loaded page by page from an external controller to the latch circuit XDL via the input/output circuit 14, and this data D0 is sequentially transferred to the latch circuits ADL and BDL (S11).

Next, the data D1 to be written to the adjacent memory cell MC01 to be written later is loaded from the external controller to the latch circuit XDL via the input/output circuit 14 page by page, and this data D1 is sequentially transferred to the latch circuits CDL and DDL (S12).

The data writing process (S13) and a program verify process (S14) are sequentially executed based on the data D0 and D1. A verify pass is checked for each bit line BL and for each verify voltage (S15), and the data writing process (S13) and the program verify process (S14) are repeated while sequentially increasing the write voltage to be applied to the memory cell MC00 at the time of data writing, until writing of all the data for two pages corresponding to the L page and U page is completed. When writing of all the data for two pages is completed, the writing process is terminated.

FIG. 10 shows the relationship between the data D0 and D1 to be written to the memory cells MC00 and MC01 and the verify voltage selected at the time of program verify of the memory cell MC00.

(1) When the write data D0 of the memory cell MC00 is Er
   In this case, since no data is written, the verify voltage is not set.
(2) When writing a value A to the memory cell MC00
   In this case, the data D1 to be written to the memory cell MC01 is referred to, and when the data D1 is Er, the verify voltage is set to Va1, and when the data D1 is A, B or C, the verify voltage is set to Va2.
(3) When writing a value B to the memory cell MC00
   In this case, the data D1 to be written to the memory cell MC01 is referred to, and when the data D1 is Er, the verify voltage is set to Vb1, and when the data D1 is A, B or C, the verify voltage is set to Vb2.
(4) When writing a value C to the memory cell MC00
   In this case, the data D1 to be written to the memory cell MC01 is referred to, and when the data D1 is Er, the verify voltage is set to Vc1, and when the data D1 is A, B or C, the verify voltage is set to Vc2.

Figure 11:
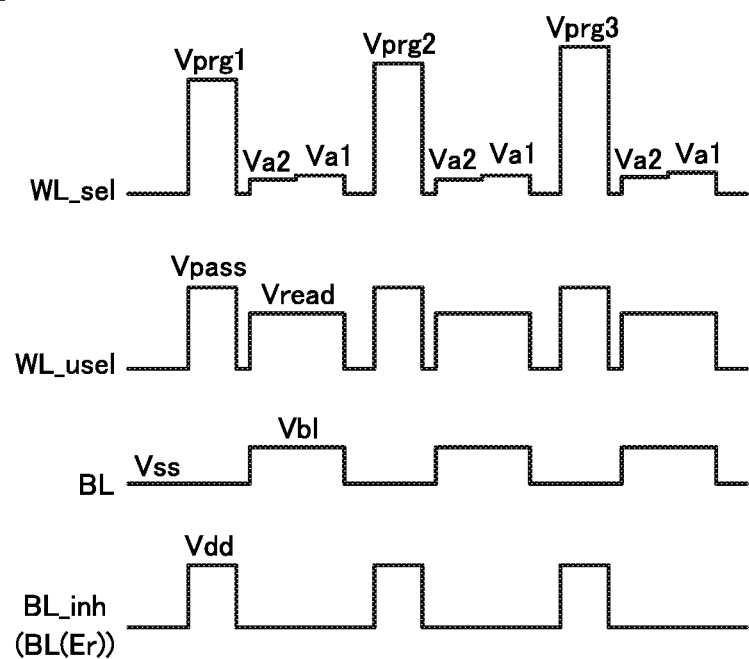
FIG. 11 is a waveform diagram showing voltages to be applied to word lines and bit lines at the time of data writing.
Figure 12:
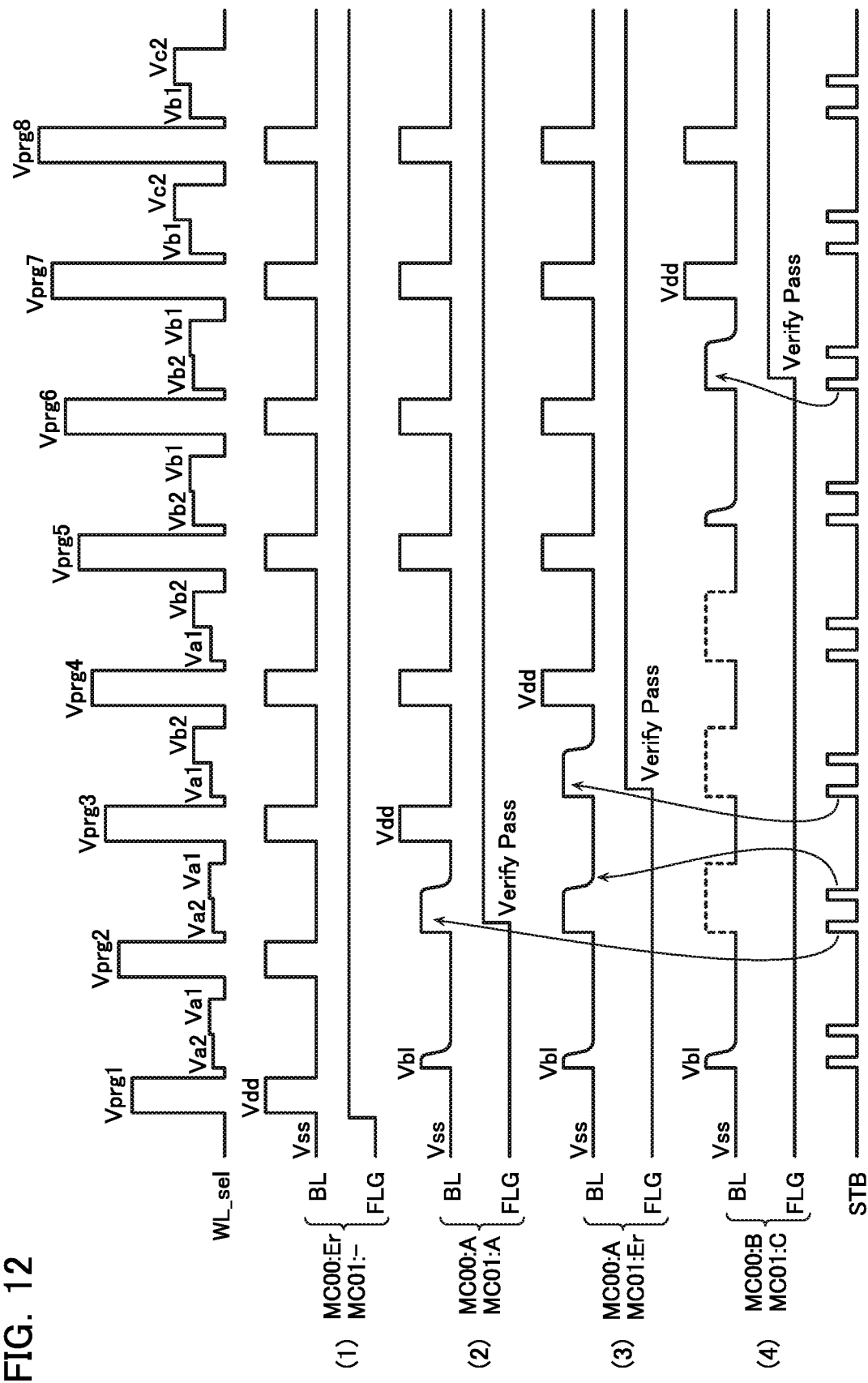
FIG. 12 is a waveform diagram showing voltages to be applied to word lines and bit lines at the time of data writing.

FIGS. 11 and 12 are waveform diagrams showing voltages to be applied to the word line WL and the bit line BL in the data writing operation. In these figures, a word line selected for writing data is denoted as WL_sel, and an unselected word line is denoted as WL_usel. Also, a bit line connected to the memory cell MC to which data is to be written is denoted as BL, and a bit line connected to the memory cell MC to which data is not written (write inhibited) is denoted as BL_inh.

As shown in FIG. 11, to write data, i.e., to write "0", the bit line BL is set to a ground voltage Vss. Moreover, when data is not written, i.e., to write "1", the bit line BL_inh is set to a power supply voltage Vdd. The power supply voltage Vdd and the ground voltage Vss are applied to the drain select gate line SGD and the source select gate line SGS. In this state, the program voltage Vprg1 is applied to the selected word line WL_sel, and the voltage Vpass is applied to the unselected word lines WL_usel. Here, the program voltage Vprg1 is about 20 V, and the voltage Vpass is about 10 V.

Accordingly, in the memory cells MC connected to the selected word line WL_sel, charges are stored in the charge accumulation film 116b from the channel formed in the semiconductor film 117 through the tunnel insulating film 116a to write data. On the other hand, in the memory cells MC connected to the bit line BL_inh to which the power supply voltage Vdd is applied, the drain select transistor STD is turned off, so that the channel becomes a floating state. Therefore, the channel is boosted, and the data is not written to the memory cells MC. In the memory cells MC connected to the unselected word line WL_usel, however, the voltage Vpass is applied to the gate, but the voltage Vpass is smaller than the program voltage Vprg, so that data is not written to the memory cells MC.

Subsequently, the program verify is executed. Although the example shows that during an interval of applying the program voltage, two kinds of verify voltages Va1 and Va2 are continuously supplied in this embodiment, a single verify voltage may be applied, or more verify voltages may be continuously applied. The program verify voltages Va1 and Va2 are supplied to the selected word line WL_sel and used to determine whether the threshold voltage of the selected memory cell MC exceeds the verify voltages Va1 and Va2. A voltage Vread which can turn on the memory cell MC irrespective of the levels of the threshold voltages of the memory cells MC is applied to the unselected word line WL_usel connected to the unselected memory cells. A voltage applied to the bit line BL is set to the voltage Vb1 that can allows the sense amplifier SA to sense the ON/OFF state of the memory cell MC. As the threshold voltage of the memory cell MC becomes higher, writing becomes harder, so that the program voltage Vprg1 is sequentially increased and applied like Vprg2, Vprg3, and so forth.

FIG. 12 is a diagram showing how the voltage applied to the bit line BL and the verify pass flag FLG change depending on the write data D0 to the memory cell MC00 and the write data D1 to the memory cell MC01. The flag FLG is obtained by sensing the voltage of a sense node of the sense amplifier SA immediately after the verify reading or a node associated therewith by the strobe signal STB. The flag FLG is transferred and held in the latch circuit DDL or the like, and is appropriately referred to by the sense amplifier SA and the sequencer 19.

(1) shows a case where Er is written to the memory cell MC00. In this case, the writing operation is not performed, so that the flag FLG is set to "1" from the beginning, and the power supply voltage Vdd is applied to the bit line BL at the time of data writing.

(2) shows a case where A is written to the memory cell MC00 and A is written to the memory cell MC01. Assuming that after the second application of the program voltage Vprg2, the OFF state of the memory cells MC00 is sensed in the verify reading with the verify voltage Va2, then, the data D0, D1 held in the latch circuits ADL to DDL are A, A, so that the operation of the operation unit OP causes the flag FLG to rise. As a result, the memory cell MC00 terminates writing at the threshold voltage indicated by A' in FIG. 7, after which the memory cell MC00 enters the write inhibit state.

(3) shows a case where A is written to the memory cell MC00 and Er is written to the memory cell MC01. In this case, for example, even if the OFF state of the memory cells MC00 is sensed in the verify reading with the verify voltage Va2 after the second application of the program voltage Vprg2, the data D0, D1 held in the latch circuits ADL to DDL are A, Er, so that the flag FLG is not set to "1" through the operation of the operation unit OP, and keeps "0". When the OFF state of the memory cells MC00 is sensed for the first time in the verify reading with the verify voltage Va1 after the third application of the program voltage Vprg3, the data D0, D1 held in the latch circuits ADL to DDL are A, Er, so that the operation of the operation unit OP causes the flag FLG to rise. As a result, the memory cell MC00 terminates writing at the threshold voltage indicated by A in FIG. 7, after which the memory cell MC00 enters the write inhibit state.

(4) shows a case where B is written to the memory cell MC00 and C is written to the memory cell MC01. In this case, for example, even if the OFF state of the memory cells MC00 is sensed in the verify reading with the verify voltage Va2 after the second application of the program voltage Vprg2, the data D0, D1 held in the latch circuits ADL to DDL are B, C, so that the flag FLG is not set to "1" through the operation of the operation unit OP, and keeps "0". Even if the OFF state of the memory cells MC00 is sensed in the verify reading with the verify voltage Va1 after the third and fourth applications of the program voltages Vprg3, Vprg4, the data D0, D1 held in the latch circuits ADL to DDL are B, C, so that the flag FLG is not set to "1" through the operation of the operation unit OP, and keeps "0". When the OFF state of the memory cells MC00 is sensed in the verify reading with the verify voltage Vb2 after the sixth application of the program voltage Vprg6, the data D0, D1 held in the latch circuits ADL to DDL are B, C, so that the operation of the operation unit OP causes the flag FLG to rise. As a result, the memory cell MC00 terminates writing at the threshold voltage indicated by B' in FIG. 7, after which the memory cell MC00 enters the write inhibit state.

As described above, according to the present embodiment, at the time of data writing to the memory cell MC00, when data D1 to be written later to the adjacent memory cell MC01 is A, B or C, the verify voltage for determining the end of writing is set small as compared with a case where data to be written later is Er. Therefore, even if the threshold voltage of the memory cell MC00 changes due to writing to the adjacent memory cell MC01, the threshold voltage can be made to approach a target threshold voltage. This makes it possible to reduce malfunctions originating from the fluctuation of the threshold voltage caused by the interference between adjacent memory cells to enhance the reliability.

Second Embodiment

Figures 13, 14:
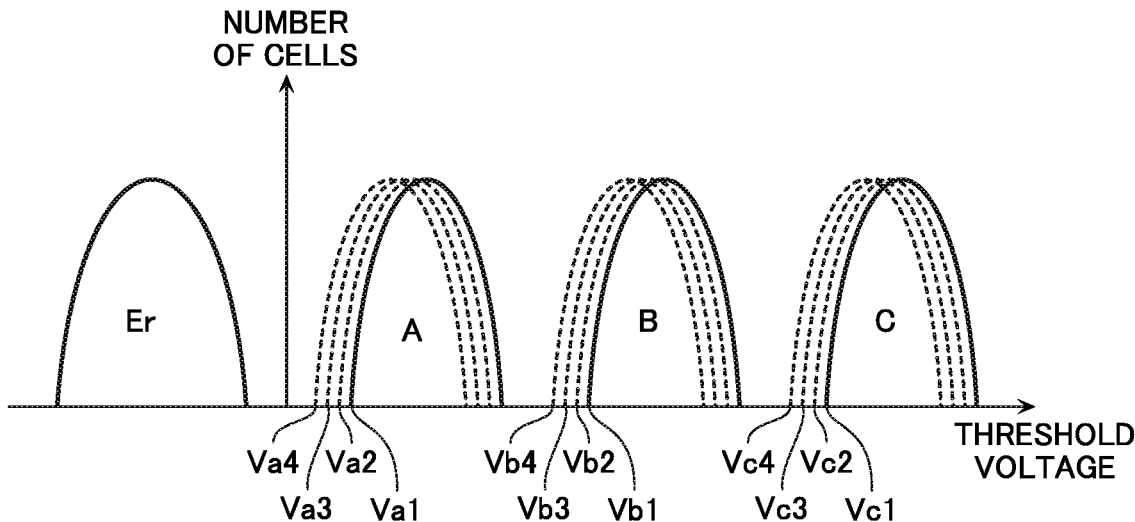
FIG. 13 is a diagram showing a relationship among a threshold voltage of memory cells, the number of memory cells, and a verify voltage of a semiconductor memory device according to a second embodiment.
FIG. 14 is a diagram showing a relationship between write data and the verify voltage of the semiconductor memory device.

FIG. 13 and FIG. 14 are diagrams for explaining a semiconductor memory device according to a second embodiment.

In the first embodiment, the verify voltage is switched between two cases where data D1 to be written later to the adjacent memory cell MC01 is Er and where data D1 to be written later is A, B, or C. In the second embodiment, the data to be written later is classified into Er, A, B, and C, and different verify voltages are set for the respective classifications.

FIG. 13 shows a relationship among the threshold voltage of the memory cell MC, the number of memory cells, and the verify voltage. In this embodiment, when A, B, or C is written as data D0, four different verify voltages are set according to the value of data D1 to be written later.

FIG. 14 shows a relationship between data to be written to the memory cells MC00 and MC01 and a verify voltage to be selected at the time of program verify of the memory cell MC00.

(1) When the write data D0 of the memory cell MC00 is Er

In this case, since no data is written, the verify voltage is not set.

(2) When writing A to the memory cell MC00

In this case, the data D1 to be written to the memory cell MC01 is referred to, and when the data D1 is Er, the verify voltage is set to Va1, when the data D1 is A, the verify voltage is set to Va2, when the data D1 is B, the verify voltage is set to Va3, and when the data D1 is C, the verify voltage is set to Va4.

(3) When writing B to the memory cell MC00

In this case, the data D1 to be written to the memory cell MC01 is referred to, and when the data D1 is Er, the verify voltage is set to Vb1, when the data D1 is A, the verify voltage is set to Vb2, when the data D1 is B, the verify voltage is set to Vb3, and when the data D1 is C, the verify voltage is set to Vb4.

(4) When writing C to the memory cell MC00

In this case, the data D1 to be written to the memory cell MC01 is referred to, and when the data D1 is Er, the verify voltage is set to Vc1, when the data D1 is A, the verify voltage is set to Vc2, when the data D1 is B, the verify voltage is set to Vc3, and when the data D1 is C, the verify voltage is set to Vc4.

Here, $Va4<Va3<Va2<Va1<Vb4<Vb3<Vb2<Vb1<Vc4<Vc3<Vc2<Vc1$.

According to the present embodiment, since the verify voltage is finely controlled according to the magnitude of the influence of data to be written later on an adjacent memory cell, it is possible to more accurately reduce malfunctions originating from the fluctuation of the threshold voltage caused by the interference between adjacent memory cells to enhance the reliability.

Third Embodiment

Figure 15:
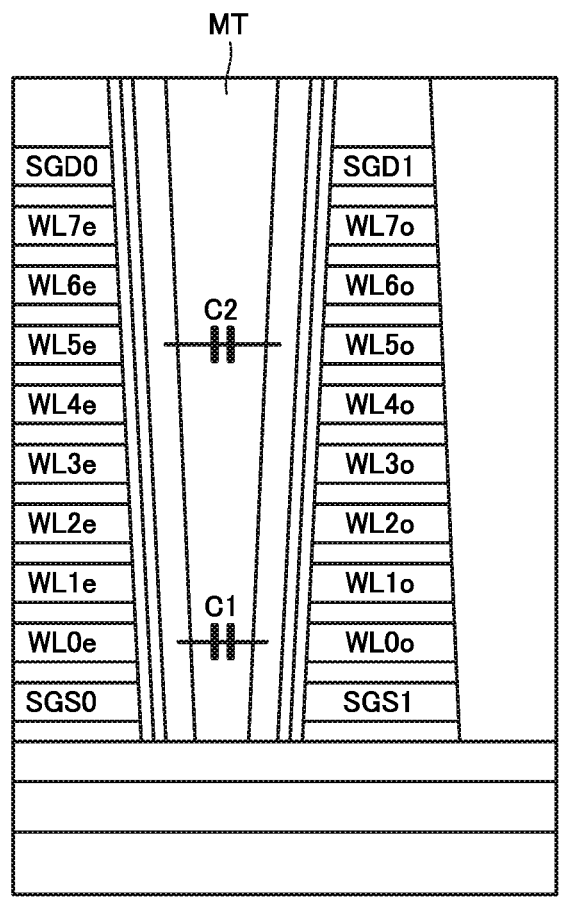
FIG. 15 is a schematic cross-sectional view of memory cells of a semiconductor memory device according to a third embodiment.

FIG. 15 is a diagram for explaining a semiconductor memory device according to a third embodiment. As shown, the memory trench MT is usually formed through groove processing such as etching to the laminate structure LS. At that time, the memory trench MT is formed in a tapered shape, so that the closer to the substrate, that is, the lower the memory cell is located in the figure, the shorter the distance between the memory cells becomes. Therefore, regarding a parasitic capacitance between channels, a parasitic capacitance C1 between lower memory cells becomes larger than a parasitic capacitance C2 between upper memory cells.

In the present embodiment, as the parasitic capacitance between adjacent memory cells is larger, or the distance between adjacent memory cells is shorter, or the distance of a pair of adjacent memory cells from the substrate is shorter, the fluctuation range of the verify voltage is set to be increased. For example, regarding the difference between the verify voltage Va1 and the verify voltage Va2 shown in FIG. 7, the difference between the verify voltages of the memory cells MC connected to the word line WL0e is greater than the difference between the verify voltages of the memory cells MC connected to a word line WL7e.

Performing such setting ensures control according to the influence of more actual inter-cell interference. When the memory trench MT is formed by two or more steps, the relationship between the upper and lower levels and the inter-cell distance does not have a fixed relationship, even in which case in consideration of the fabrication process of the semiconductor memory device, the distance between the memory cells should be grasped, and an appropriate verify voltage corresponding to the word line should be set based on the distance between the memory cells. Further, not only the distance between the memory cells but also the width of the lower portion of the insulating part 119, for example, becomes narrower than the width of the upper portion. Therefore, the Y-directional length of the channel of the opposing memory cell becomes longer at the lower portion than at the upper portion. Since the parasitic capacitance becomes larger as the length of the opposing channel gets longer, the fluctuation range of the verify voltage in the lower memory cell MC may be further widened.

Fourth Embodiment

Figure 16:
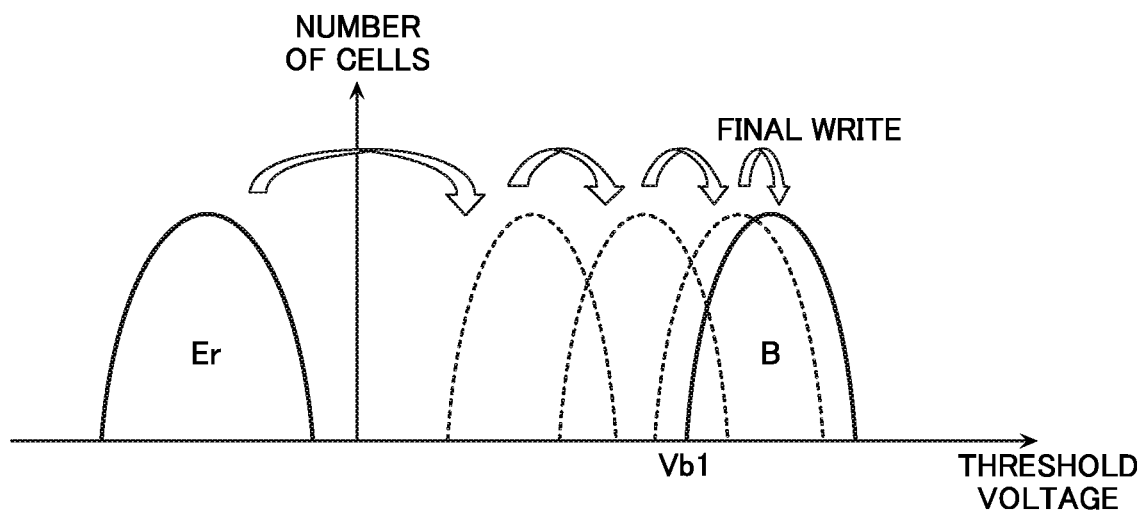
FIG. 16 is a diagram showing a writing operation and a change in threshold level of a semiconductor memory device according to a fourth embodiment.
Figure 18:
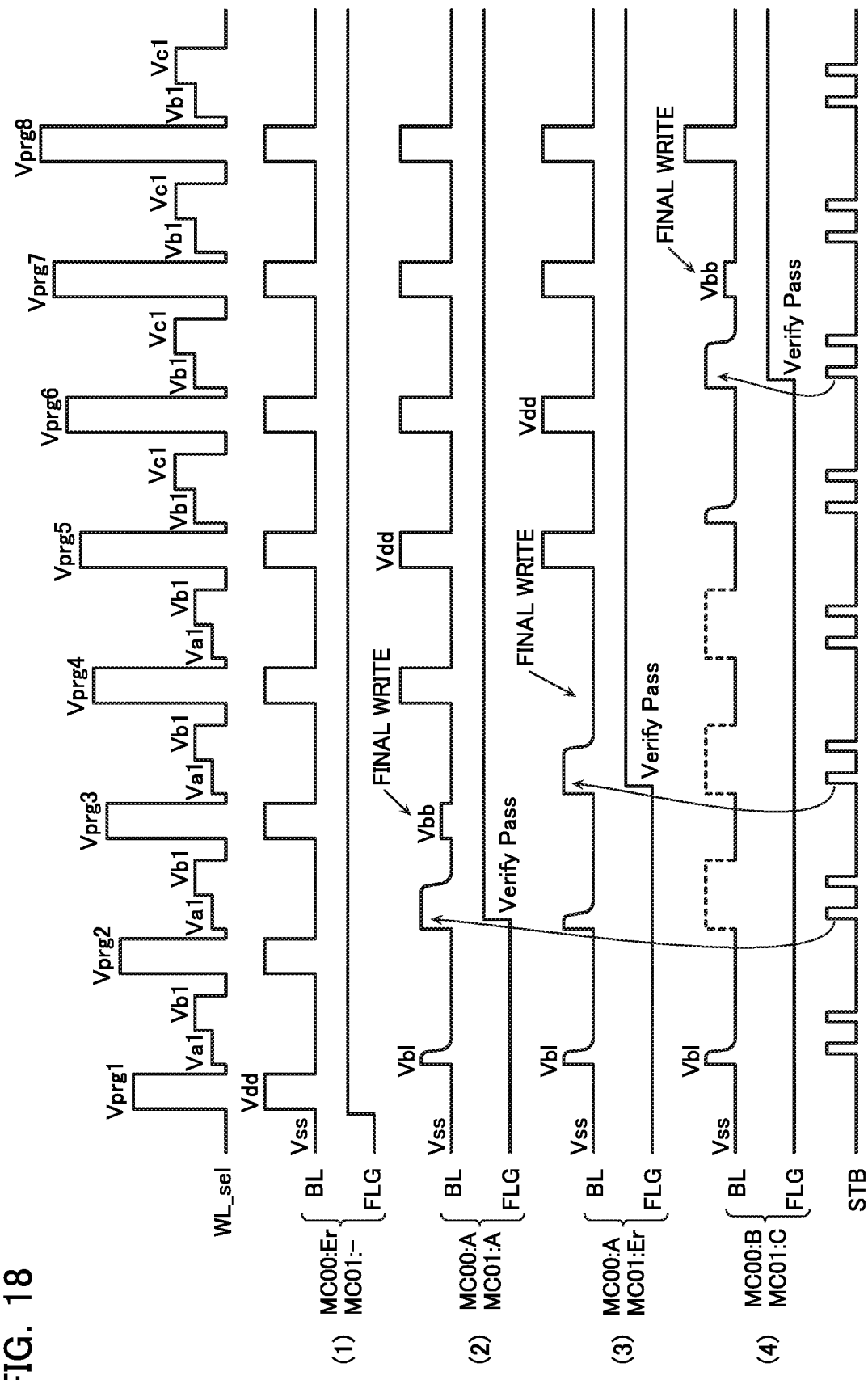
FIG. 18 is a waveform diagram showing voltages to be applied to word lines and bit lines at the time of data writing of the semiconductor memory device.

FIGS. 16 to 18 are diagrams for explaining a semiconductor memory device according to a fourth embodiment.

In the foregoing embodiments, the writing process is terminated when a program verify read process is performed after the application of the program voltage Vprg. In contrast, as shown in FIG. 16, for example, there is a known writing method in which a writing process and program verify process are performed multiple times, and when the threshold value of the memory cell MC exceeds the verify voltage Vb1, the writing process is finally performed only once, and is terminated without performing the program verify process. In such a writing method, controlling the degree of writing at the time of final write can provide the same effects as the foregoing embodiments in which different verify voltages are provided. Specifically, the voltage of the bit line BL at the time of final write is adjusted.

FIG. 17 shows a relationship between data to be written to the memory cells MC00 and MC01 and a voltage applied to the bit line BL at the time of final write to the memory cell MC00.

(1) When the write data D0 of the memory cell MC00 is Er

In this case, since data is not written, the bit line BL maintains the write inhibit voltage at the time of data writing.

(2) When writing A, B, or C to the memory cell MC00

In this case, the data D1 to be written to the memory cell MC01 is referred to, and when the data D1 is Er, the bit line voltage at the time of final write is maintained at Vss, and when the data D1 is A, B or C, the bit line voltage at the time of final write is set to Vbb (Vbb>Vss). As the bit line voltage becomes Vbb, the difference between the channel voltage of the memory cell MC00 and the program voltage Vprg of the word line WL becomes small as compared with the case where the bit line voltage is Vss, making a change in threshold voltage smaller.

FIG. 18 is a diagram showing how the voltage applied to the bit line BL and the verify pass flag FLG change depending on the write data D0 to the memory cell MC00 and the write data D1 to the memory cell MC01.

In the present embodiment, the verify voltages are typical three kinds of voltages Va1, Vb1, and Vc1, and the bit line voltage at the time of final write after verify pass varies depending on the data in the memory cell MC01.

The present embodiment can also provide the same effects as the first embodiment. It should be noted that the voltage of the bit line BL at the time of final write may be set not only to two kinds, Vss and Vbb, but also to four kinds of voltages according to the write data D1 as in the second embodiment. Further, the bit line voltage may be changed according to the position of the word line WL as in the third embodiment.

Fifth Embodiment

In the foregoing embodiments, an MLC (Multiple Level Cell) that stores 2-bit data for each memory cell MC is taken as an example, but the concept of the foregoing embodiments can be applied to all the semiconductor memory devices including a binary type and multi-value type, such as an SLC (Single Level Cell) that stores 1-bit data, a TLC (Triple Level Cell) that stores 3-bit data, and a QLC (Quad Level Cell) that stores 4-bit data for each memory cell MC.

Figure 19:
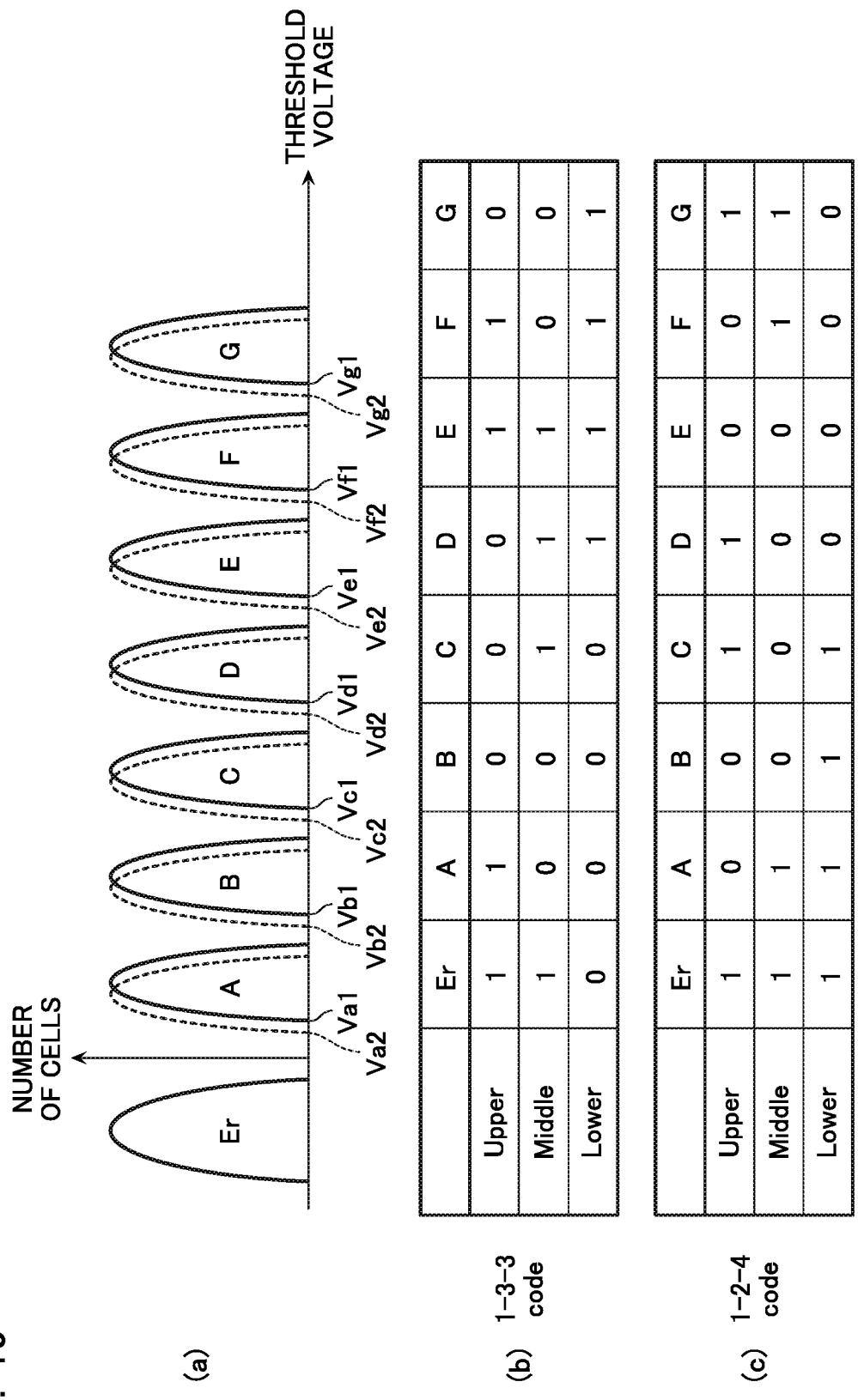
FIG. 19 is a diagram showing a relationship between a threshold level corresponding to each data and bit data in a semiconductor memory device according to a fifth embodiment.
Figures 20, 21:
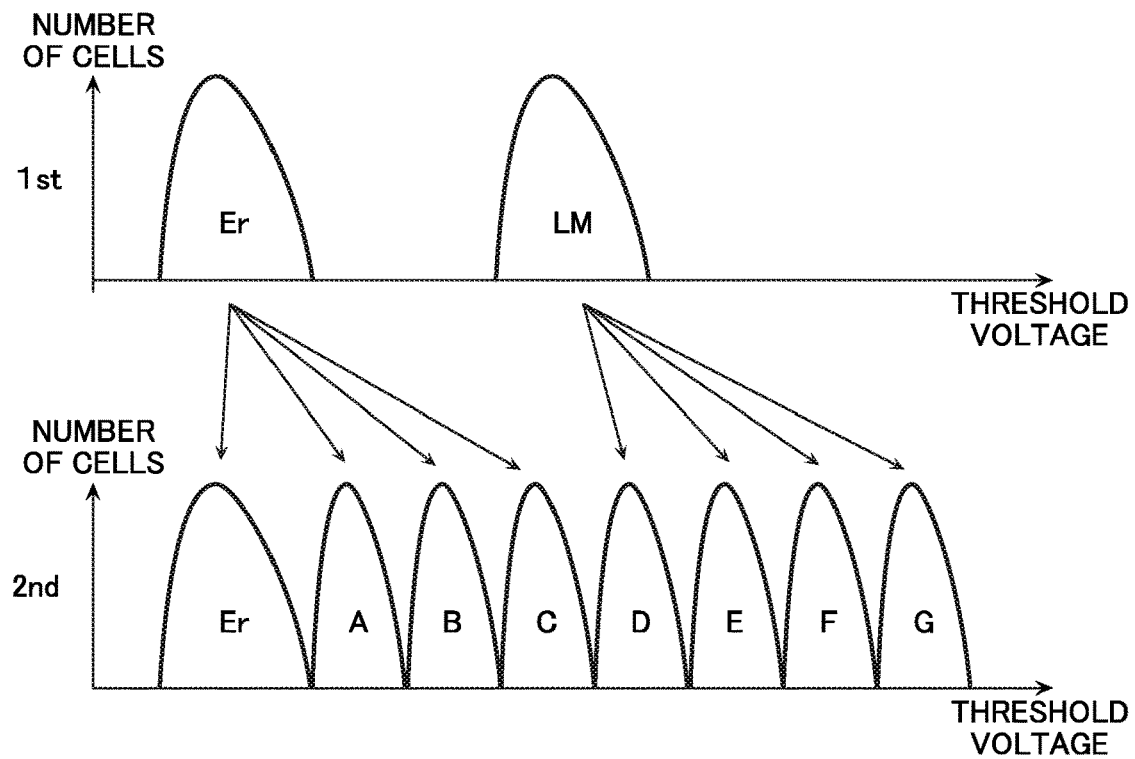
FIG. 20 is a diagram showing a relationship between write data and the verify voltage of the semiconductor memory device.
FIG. 21 is a diagram showing the distribution of threshold levels in a semiconductor memory device according to a sixth embodiment.

FIGS. 19 and 20 are diagrams for explaining a semiconductor memory device according to a fifth embodiment. In this embodiment, an example of TLC is shown.

As shown in FIG. 19(a), in the case of TLC, eight threshold value distributions Er, A, B, C, D, E, F, and G are made to correspond to 8-value data of 3 bits. In this case, latch circuits in the sense amplifier unit 120 are added in correspondence to an increase in the capacity for data stored in the memory cell MC, and in the case of TLC, generally, seven latch circuits including XDL are provided.

In contrast, the use of a 1-3-3 code shown in FIG. 19(b), a 1-2-4 code shown in FIG. 19(c) or the like as a method of arranging 3-bit data, for example, can reduce the number of additional latch circuits. That is, these 3-bit data are composed of three pages of an L (Lower) page, an M (Middle) page and a U (Upper) page. Paying attention to the L page, Er, A, B, and C levels are "0", and D, E, F, and G levels are "1" in the 1-3-3 code, and Er, A, B, and C levels are "1", and D, E, F, and G levels are "0" in the 1-2-4 code. As described above, in the 1-3-3 code and the 1-2-4 code, whether the range of the threshold voltage is located in the lower region (Er, A, B, C) or in the higher regions (D, E, F, G) can be identified by referring to the L page.

Accordingly, of data to be written later in the adjacent memory cell MC01, only data of the L page is loaded into one latch circuit in the sense amplifier unit 120, for example, the latch circuit CDL, in advance. When writing to the memory cell MC00, the verify voltage or the bit line voltage at the time of final write is selected with reference to the latch circuit CDL.

FIG. 20 shows a relationship between data to be written to the memory cells MC00 and MC01 (only the L page) and the verify voltage selected at the time of program verify to the memory cell MC00 when the 1-3-3 code is used.

When the write data D0 to the memory cell MC00 takes the value A, B, C, D, E, F, or G, the following is the verify voltage used.
(1) Va2, Vb2, Vc2, Vd2, Ve2, Vf2 or Vg2, respectively, when data to be written to the L page of the memory cell MC01 is "1".
(2) Va1, Vb1, Vc1, Vd1, Ve1, Vf1 or Vg1, respectively, when data to be written to the L page of the memory cell MC01 is "0".

Here, as also shown in FIG. 19, Va2<Va1<Vb2<Vb1<Vc2<Vc1<Vd2<Vd1<Ve2<Ve1<Vf2<Vf1<Vg2<Vg1.

Sixth Embodiment

In the foregoing embodiments, an example of full-sequence writing process in which data is written into the individual memory cells MC to the last in a single sequence is illustrated. In contrast, the concept of the foregoing embodiments can also be applied to a semiconductor memory device using a writing method in which writing to one memory cell MC is performed in multiple stages.

FIG. 21 is a diagram showing the distribution of threshold levels of a semiconductor memory device according to a sixth embodiment. FIG. 21 shows an example of two-stage writing. In a first stage, the Er level is maintained or writing to the LM level is performed, based on data of a first page with respect to the erase state (Er). In a second stage, writing of the A, B, C level from the Er level, or writing of the D, E, F, G level from the LM level is performed based on data of a second page and a third page. Adjustment of the verify voltage or the bit line voltage at the time of final write is carried out for the preceding write memory cell MC of the second stage.

Figures 22, 23, 24:
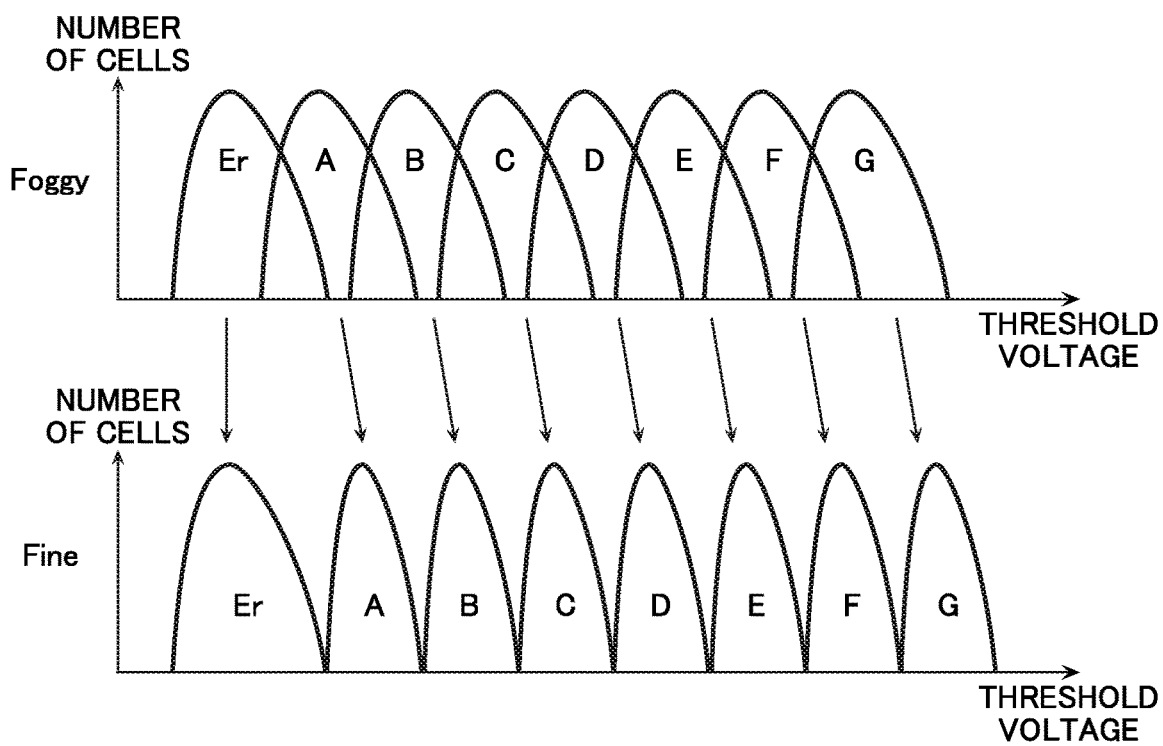
FIG. 22 is a diagram showing the writing order of the semiconductor memory device.
FIG. 23 is a diagram showing the distribution of threshold levels in a semiconductor memory device according to a seventh embodiment.
FIG. 24 is a diagram showing the writing order of the semiconductor memory device.

FIG. 22 is a diagram showing the order of writing to the memory cells MC. The numerals in the table indicate the writing order.

First, the first-stage writing is performed to the memory cell MC00 connected to the word line WL0e (1). Next, the first-stage writing is performed to the memory cell MC01 connected to the word line WL0o (2). Next, the second-stage writing is performed to the memory cell MC00 connected to the word line WL0e (3). Finally, the second-stage writing is performed to the memory cell MC01 connected to the word line WL0o (4).

Through the above processing, the writing operation to the memory cells MC00 and MC01 connected to the word lines WL0e and WL0o is completed. Here, at the time of the third writing operation, with reference to the data in the memory cell MC01 to be written in the fourth writing, the verify voltage at the time of the writing operation to the memory cell MC00 is selected, or the bit line voltage at the time of final write is selected. Numerical values encircled in the figure indicate timings at which the verify voltage or the bit line voltage at the time of final write is adjusted. Arrows in the figure indicate write data to be referenced during adjustment. Thereafter, the same process is performed on the word lines WL1e, WL1o, WL2e, WL2o, and so forth. It should be noted that the numerical values encircled in the figures and the arrows also indicate the same contents as those in FIG. 22 in the subsequent figures showing the order of writing to the memory cells MC.

Here, the case of adjusting the verify voltage is taken as an example. Now, suppose that data to be written to the memory cell MC00 in the third process is A. When data to be written to the memory cell MC01 in the fourth process is Er, A, B, C, D, E, F, or G, the verify voltages at the time of the third second-stage writing to the memory cell MC00 are respectively set to, for example, Va1, Va2, Va3, Va4, Va5, Va6, Va1, and Va8 where Va1>Va2>Va3>Va4, and Va5>Va6>Va7>Va8. Alternatively, Va1=Va5>Va2=Va6>Va3=Va7>Va4=Va8.

Seventh Embodiment

FIG. 23 is a diagram showing the distribution of threshold levels of a semiconductor memory device according to a seventh embodiment. FIG. 23 shows an example of Foggy_Fine writing.

For the memory cell MC, A, B, C, D, E, F or G is roughly written in the first stage and is accurately written in the second stage. Adjustment of the verify voltage or the bit line voltage at the time of final write is performed for the preceding write memory cell MC of the second stage.

FIG. 24 is a diagram showing the order of writing to the memory cells MC. The numerals in the table indicate the writing order. Since this writing operation is also basically the same as the writing operation described with reference to FIG. 22 in the writing order, the detailed description will be omitted.

As in the above description, the case of adjusting the verify voltage is taken as an example. Now, suppose that data to be written to the memory cell MC00 in the third process is A. When data to be written to the memory cell MC01 in the fourth process is Er, A, B, C, D, E, F, or G, the verify voltages at the time of the third Fine-stage writing to the memory cell MC00 are respectively set to, for example, Va1, Va2, Va3, Va4, Va5, Va6, Va1, and Va8 where Va1>Va2>Va3>Va4>Va5>Va6>Va7>Va8.

Eighth Embodiment

A semiconductor memory device according to this embodiment differs from the foregoing embodiments in the order of writing to the memory cells MC in a case where writing to one memory cell MC is carried out in multiple stages. In the eighth embodiment, not only the parasitic capacitances of memory cells adjacent in the X direction but also the parasitic capacitances to memory cells adjacent in the Z direction are considered.

FIG. 25 shows the order of writing to the memory cells MC. The numerals in the table indicate the writing order. The present embodiment is an example where after the first-stage or Foggy-stage writing to the memory cells MC000 and MC010 connected to the word lines WL0e and WL0o (1, 2), the first-stage or Foggy-stage writing to the memory cells MC001 and MC011 connected to the word line WL1e overlying by one layer is performed (3), then the second-stage or Fine-stage writing to the word line WL0e is performed (4), subsequently the first-stage or Foggy-stage writing to the word line WL10 is performed (5), and the second-stage or Fine-stage writing to the word line WL0o is performed (6). In this case, for example, in the fourth writing operation, at least one of the sixth write data which is the second stage or Fine stage of the memory cell MC010, and the eighth write data which is the second stage or the Fine stage of the memory cell MC001 is referred to, to select the verify voltage or the bit line voltage at the time of final write.

Ninth Embodiment

A semiconductor memory device according to this embodiment further differs from the foregoing embodiments in the order of writing to the memory cells MC in a case where writing to one memory cell MC is carried out in multiple stages. In the ninth embodiment, not only the parasitic capacitances of memory cells adjacent in the X direction but also the parasitic capacitances of memory cells adjacent in the Z direction and the parasitic capacitances of memory cells adjacent in the XZ direction are considered.

FIG. 26 shows the order of writing to the memory cells MC. The numerals in the table indicate the writing order. The present embodiment is an example where after the first-stage or Foggy-stage writing to the memory cells MC000 and MC010 connected to the word lines WL0e and WL0o (1, 2), the first-stage or Foggy-stage writing to the memory cells MC001 and MC011 connected to the word lines WL1e, WL10 overlying by one layer is performed (3, 4), and then the second-stage or Fine-stage writing to the word lines WL0e, WL0o is performed (5, 6). In this case, for example, in the fifth writing operation to the memory cell MC000, at least one of the sixth write data which is the second stage or Fine stage of the memory cell MC010, the ninth write data which is the second stage or the Fine stage of the memory cell MC001, and the tenth write data which is the second stage or the Fine stage of the memory cell MC011 is referred to, to select the verify voltage or the bit line voltage at the time of final write.

[Others]

While certain embodiments have been described, these embodiments have been presented by way of example only, and, are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a memory cell array including a plurality of memory cells arrayed in a first direction crossing the substrate and a second direction crossing the first direction, the memory cells being capable of storing data indicating a plurality of values corresponding to a plurality of threshold levels; and
   a control circuit that applies a predetermined voltage to the memory cells to change threshold voltages of the memory cells to a threshold level corresponding to a value of data to be stored respectively, and terminates writing of the data when the threshold level of the memory cells exceeds a predetermined verify voltage, wherein
   the memory cell array includes a first memory cell in which first data is stored and a second memory cell adjacent to the first memory cell and in which second data is written after the writing to the first memory cell, and
   the control circuit refers to the second data at a time of writing the first data to the first memory cell, and when a value of the second data corresponds to a first threshold level, sets the verify voltage to a first verify voltage, and when the value of the second data corresponds to a second threshold level greater than the first threshold level, sets the verify voltage to a second verify voltage smaller than the first verify voltage.

2. The semiconductor memory device according to claim 1, wherein
   when the value of the second data corresponds to a third threshold level greater than the second threshold level, the control circuit sets the verify voltage to the second verify voltage, and when the value of the second data corresponds to a fourth threshold level greater than the third threshold level, sets the verify voltage to the second verify voltage.

3. The semiconductor memory device according to claim 1, wherein
   when the value of the second data corresponds to a third threshold level greater than the second threshold level, the control circuit sets the verify voltage to a third verify voltage smaller than the second verify voltage, and when the value of the second data corresponds to a fourth threshold level greater than the third threshold level, sets the verify voltage to a fourth verify voltage smaller than the third verify voltage.

4. The semiconductor memory device according to claim 1, wherein
the first memory cell and the second memory cell are disposed at substantially the same position in the first direction, and are adjacent to each other in the second direction.

5. The semiconductor memory device according to claim 4, further comprising:
a first conductive layer; and
a second conductive layer disposed apart from the first conductive layer in the second direction, wherein
the first memory cell and the second memory cell are disposed between the first conductive layer and the second conductive layer,
the first memory cell is connected to the first conductive layer, and
the second memory cell is connected to the second conductive layer.

6. The semiconductor memory device according to claim 4, wherein
the memory cell array further includes a third memory cell in which third data is stored and a fourth memory cell in which fourth data is written after the writing to the third memory cell,
the third memory cell and the fourth memory cell are adjacent to each other in the second direction,
a distance between the first memory cell and the second memory cell is smaller than a distance between the third memory cell and the fourth memory cell, and
the control circuit refers to the fourth data at a time of writing the third data to the third memory cell, and when a value of the fourth data corresponds to the first threshold level, sets the verify voltage to be applied to the third memory cell to the first verify voltage, and when the value of the fourth data corresponds to the second threshold level, sets the verify voltage to be applied to the third memory cell to a fifth verify voltage smaller than the first verify voltage and greater than the second verify voltage.

7. The semiconductor memory device according to claim 6, wherein
the third memory cell and the fourth memory cell are disposed at different positions in the first direction from the first memory cell and the second memory cell, and
the first memory cell and the second memory cell are closer to the substrate than the third memory cell and the fourth memory cell.

8. The semiconductor memory device according to claim 1, wherein
the memory cells each store data corresponding to a plurality of bits,
the control circuit repeatedly writes and verifies data to the first memory cell until the writing of the first data is completed, and after the writing of the first data to the first memory cell is completed, executes writing the second data to the second memory cell of an erased state.

9. The semiconductor memory device according to claim 1, wherein the memory cells each store data corresponding to a plurality of bits, a specific bit of the data indicates which one of a lower threshold level range and a higher threshold level range of the plurality of threshold levels,
the control circuit refers to the specific bit of the second data at a time of writing the first data to the first memory cell, when a value of the specific bit indicates the lower threshold level range, sets the verify voltage to the first verify voltage, and when the value of the specific bit indicates the higher threshold level range, sets the verify voltage to the second verify voltage.

10. The semiconductor memory device according to claim 1, wherein
the control circuit executes, after an initial writing operation to the first memory cell, an initial writing operation to the second memory cell, then executes a final writing operation to the first memory cell, and at a time of the final writing operation, refers to the second data, and sets the verify voltage to the first verify voltage or the second verify voltage according to the value of the second data.

11. A semiconductor memory device comprising:
a substrate;
a memory cell array including:
a first memory string including a plurality of memory cells connected in series in a first direction crossing the substrate;
a second memory string including a plurality of memory cells connected in series in the first direction, and being adjacent to the first memory string in a second direction crossing the first direction;
a plurality of first conductive layers respectively connected to the memory cells of the first memory string and arranged in the first direction;
a plurality of second conductive layers respectively connected to the memory cells of the second memory string and arranged in the first direction; and
a third conductive layer connected to one end of the first memory string, the memory cells being capable of storing data indicating a plurality of values corresponding to a plurality of threshold levels; and
a control circuit that applies a predetermined voltage to the first to third conductive layers according to a plurality of writing steps, to change threshold voltages of the memory cells to a threshold level corresponding to a value of data to be stored respectively, and performs a final writing step to terminate writing of the data to a certain memory cell when the threshold level of the certain memory cell exceeds a predetermined verify voltage, wherein
the memory cell array includes a first memory cell in which first data is stored and a second memory cell adjacent to the first memory cell and in which second data is written after the writing to the first memory cell, the first memory cell being included in the first memory string, and
the control circuit refers to the second data at a time of writing the first data to the first memory cell, and when a value of the second data corresponds to a first threshold level, sets a voltage to be applied to the third conductive layer in the final writing step to a first voltage, and when the value of the second data corresponds to a second threshold level greater than the first threshold level, sets the voltage to be applied to the third conductive layer in the final writing step to a second voltage greater than the first voltage.

12. The semiconductor memory device according to claim 11, wherein
the control circuit sets the voltage to be applied to the third conductive layer in the final writing step to the second voltage when the value of the second data corresponds to a third threshold level greater than the second threshold level, and sets the voltage to be applied to the third conductive layer in the final writing step to the second voltage when the value of the second data corresponds to a fourth threshold level greater than the third threshold level.

13. The semiconductor memory device according to claim 11, wherein
the control circuit sets the voltage to be applied to the third conductive layer in the final writing step to a third voltage greater than the second voltage when the value of the second data corresponds to a third threshold level greater than the second threshold level, and sets the voltage to be applied to the third conductive layer in the final writing step to a fourth voltage greater than the third voltage when the value of the second data corresponds to a fourth threshold level greater than the third threshold level.

14. The semiconductor memory device according to claim 11, wherein
the first memory cell and the second memory cell are disposed at substantially the same position in the first direction, and are adjacent to each other in the second direction.

15. The semiconductor memory device according to claim 11, wherein
the first memory string and the second memory string are disposed between the first conductive layers and the second conductive layers.

16. The semiconductor memory device according to claim 14, wherein
the memory cell array further includes a third memory cell in which third data is stored and a fourth memory cell in which fourth data is written after the writing to the third memory cell, the third memory cell being included in the first memory string,
the third memory cell and the fourth memory cell are adjacent to each other in the second direction,
a distance between the first memory cell and the second memory cell is smaller than a distance between the third memory cell and the fourth memory cell,
the control circuit refers to the fourth data at a time of writing the third data to the third memory cell, and when a value of the fourth data corresponds to the first threshold level, sets the voltage to be applied to the third conductive layer in the final writing step of the third memory cell to the first voltage, and when the value of the fourth data corresponds to the second threshold level, sets the voltage to be applied to the third conductive layer in the final writing step of the third memory cell to a fifth voltage greater than the first voltage and smaller than the second voltage.

17. The semiconductor memory device according to claim 16, wherein
the third memory cell and the fourth memory cell are disposed at different positions in the first direction from the first memory cell and the second memory cell, and
the first memory cell and the second memory cell are closer to the substrate than the third memory cell and the fourth memory cell.

18. The semiconductor memory device according to claim 11, wherein
the memory cells each store data corresponding to a plurality of bits,
the control circuit repeatedly writes and verifies data to the first memory cell until the writing of the first data is completed, and after the writing of the first data to the first memory cell is completed, executes writing the second data to the second memory cell of an erased state.

19. The semiconductor memory device according to claim 11, wherein
the memory cells each store data corresponding to a plurality of bits, a specific bit of the data indicates which one of a lower threshold level range and a higher threshold level range of the plurality of threshold levels,
the control circuit refers to the specific bit of the second data at a time of writing the first data to the first memory cell, when a value of the specific bit indicates the lower threshold level range, sets the voltage to be applied to the third conductive layer in the final writing step to the first voltage, and when the value of the specific bit indicates the higher threshold level range, sets the voltage to be applied to the third conductive layer in the final writing step to the second voltage.

20. The semiconductor memory device according to claim 11, wherein
the control circuit executes, after an initial writing operation to the first memory cell, an initial writing operation to the second memory cell, then executes a final writing operation to the first memory cell, and at a time of the final writing operation, refers to the second data, and sets the first voltage or the second voltage as the voltage to be applied to the third conductive layer in the final writing step according to the value of the second data.

* * * * *